United States Patent
Mares et al.

(10) Patent No.: US 11,196,390 B2
(45) Date of Patent: Dec. 7, 2021

(54) POWER AMPLIFIER DEVICES CONTAINING FRONTSIDE HEAT EXTRACTION STRUCTURES AND METHODS FOR THE FABRICATION THEREOF

(71) Applicant: NXP USA, Inc., Austin, TX (US)

(72) Inventors: Edward Christian Mares, Gilbert, AZ (US); Lakshminarayan Viswanathan, Phoenix, AZ (US); David James Dougherty, Tempe, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/857,134

(22) Filed: Apr. 23, 2020

(65) Prior Publication Data
US 2021/0336585 A1    Oct. 28, 2021

(51) Int. Cl.
*H03F 3/187*    (2006.01)
*H03F 1/30*    (2006.01)
*H03F 3/193*    (2006.01)
*H03F 3/213*    (2006.01)

(52) U.S. Cl.
CPC ............. *H03F 1/301* (2013.01); *H03F 3/193* (2013.01); *H03F 3/213* (2013.01)

(58) Field of Classification Search
CPC .................................................... H03F 3/187
USPC .................................................... 330/307, 66
See application file for complete search history.

(56) References Cited

U.S. PATENT DOCUMENTS 8,859,337 B2    10/2014    Gaul et al.
8,962,308 B2 *    2/2015    Wilson ............... G01N 35/1081
                                                        435/287.2
9,362,198 B2    6/2016    Viswanathan et al.
(Continued)

FOREIGN PATENT DOCUMENTS

CN    108447827 B    4/2020
JP    H07-58469 A    3/1995
JP    2006-156465 A    6/2006

OTHER PUBLICATIONS

Hu, Ian et al; "High Thermal Performance Package with Anisotropic Thermal Conductive Material"; IEEE Electronic Components and Technology Conference; 7 pages (2017).

*Primary Examiner* — Henry Choe

(57) ABSTRACT

Power amplifier devices and methods for fabricating power amplifier devices containing frontside heat extraction structures are disclosed. In embodiments, the power amplifier device includes a substrate, a radio frequency (RF) power die bonded to a die support surface of the substrate, and a frontside heat extraction structure further attached to the die support surface. The frontside heat extraction structure includes, in turn, a transistor-overlay portion in direct thermal contact with a frontside of the RF power die, a first heatsink coupling portion thermally coupled to a heatsink region of the substrate, and a primary heat extraction path extending from the transistor-overlay portion to the first heatsink coupling portion. The primary heat extraction path promotes conductive heat transfer from the RF power die to the heatsink region and reduce local temperatures within a transistor channel of the RF power die during operation of the power amplifier device.

20 Claims, 8 Drawing Sheets

(56) References Cited

U.S. PATENT DOCUMENTS

2004/0188831 A1    9/2004  Hsiao
2013/0249375 A1*   9/2013  Panagotacos .......... B64D 47/04
                                                      313/13

* cited by examiner

POWER AMPLIFIER DEVICES CONTAINING FRONTSIDE HEAT EXTRACTION STRUCTURES AND METHODS FOR THE FABRICATION THEREOF

TECHNICAL FIELD

Embodiments of the present disclosure relate generally to microelectronics and, more particularly, to power amplifier devices (e.g., packages and modules) containing frontside heat extraction structure, as well to methods for the fabrication thereof.

BACKGROUND

A power amplifier device typically contains at least one radio frequency (RF) power die into which one or more transistors are integrated. The RF power die may contain, in turn, a body of semiconductor material in which a transistor channel is formed and above which frontside layers are successively compiled or built-up during wafer level processing. The frontside layers define various electrically-conductive features of the RF power die, such as bond pads, interconnect lines, and the transistor contacts; e.g., drain lines, a drain manifold, gate contact fingers, and a gate contact manifold in the case of a field effect transistor. The RF power die may be attached to a substrate, such as a printed circuit board or a metallic base flange, by bonding the backside of the die to the substrate. When at least partly composed of a metal or another thermally-conductive material, the substrate may serve as a heatsink to help conductively absorb and dissipate some fraction of the excess heat generated during device operation. The mere provision of a heatsink, however, may be inadequate to prevent undesirably elevated local temperatures or "hot spots" from developing within an RF power die contained within a power amplifier device in certain instances, such as when the RF power die operates at higher radio frequencies (e.g., frequencies approaching or exceeding 3 Gigahertz) or is produced utilizing a die technology having a relatively high power density.

BRIEF DESCRIPTION OF THE DRAWINGS

At least one example of the present invention will hereinafter be described in conjunction with the following figures, wherein like numerals denote like elements, and.

Figure 1:
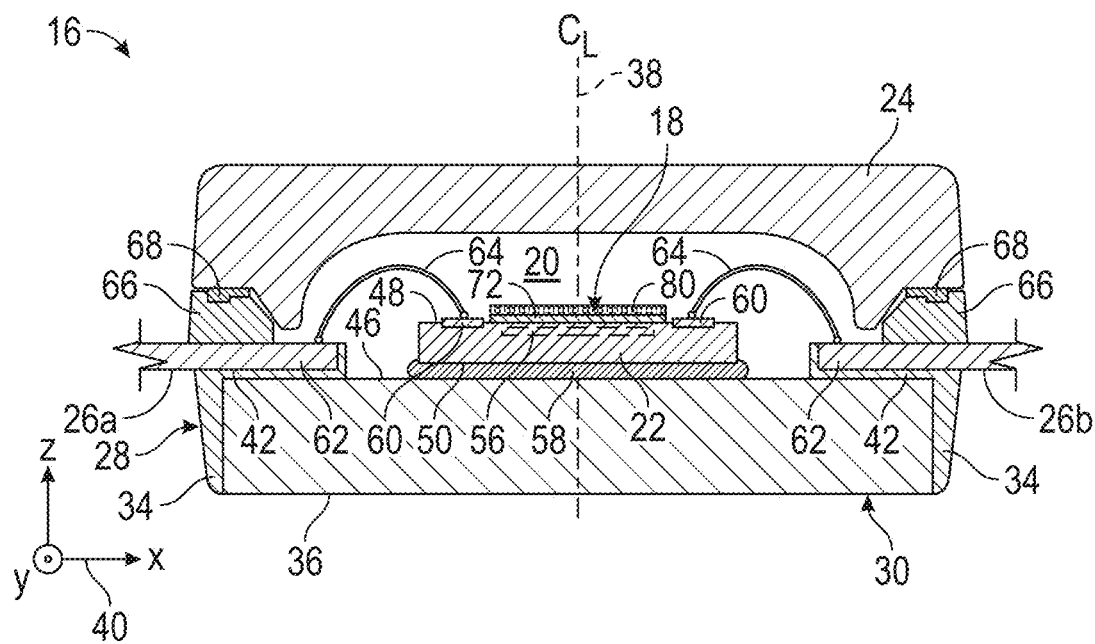
FIGS. 1 and 2 are simplified cross-sectional and cross-sectional isometric views, respectively, illustrating an example power amplifier device (here, a power amplifier package) containing a frontside heat extraction structure and a retention clip, as illustrated in accordance with an example embodiment of the present disclosure.

For simplicity and clarity of illustration, descriptions and details of well-known features and techniques may be omitted to avoid unnecessarily obscuring the example and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

Embodiments of the present disclosure are shown in the accompanying figures of the drawings described briefly above. Various modifications to the example embodiments may be contemplated by one of skill in the art without departing from the scope of the present invention, as set-forth the appended claims. Terms of orientation, such as "upper," "lower," "over," under," "overlay," and "underneath," as appearing throughout document, are defined with respect to the proximity to a die support substrate, such as a base flange, a ceramic substrate, or printed circuit board (PCB).

Definitions

The following definitions apply throughout this document. Those terms not expressly defined here or elsewhere in this document are assigned their ordinary meaning in the relevant technical field.

Backside—the side (outer principal surface) of a die opposite the frontside of the die (defined below), as taken along an axis orthogonal to the frontside of the die.

Direct thermal contact—a term describing the relationship between adjacent structural features or elements placed in thermal communication by direct (intimate) physical contact or by being bonded together utilizing a thermally-conductive bonding material.

Frontside—the side (outer principal surface) of a die on which the bond pads are exclusively or predominately located.

Heatsink region—a thermally-conductive region of a substrate utilized for heat dissipation purposes. The thermally-conductive region can make-up the entirety or substantial entirety of the substrate as in the case of a thermally-conductive base flange. Alternatively, the thermally-conductive region (or regions) may form only a portion of the substrate as in the case of a metallic coin or thermal via structure (e.g., a via farm or bar vias) embedded in a PCB, in a ceramic substrate, or in another substrate.

Metallic—a material predominately composed of one or more metal constituents by weight percentage.

Power amplification device—a power amplification package, a power amplification module (PAM), or another electronic device containing at least one radio frequency (RF) power die utilized for signal amplification purposes.

Radio frequency (RF) power die—a semiconductor die bearing an integrated circuit (IC) containing at least one transistor utilized for RF power or signal amplification purposes.

Thermally Conductive—having a thermal conductivity exceeding 10 watts per meter-Kelvin (W/mk).

Vertical—a direction substantially orthogonal to the die support surface of a substrate, such as a base flange or a PCB, to which at least one RF power die is attached.

Overview

As mentioned above, RF power dies contained in power amplifier devices may be prone to excess heat generation and thermal build-up during device operation, particularly at regions within the RF power dies located in and adjacent the transistor channels. Existing thermal solutions for dissipating excess die-generated heat typically rely extracting heat from the power amplifier device along a primary heat extraction path extending from the heat-generating die (or dies), through the bond layer utilized to attach the die to a substrate, and to a thermally-conductive heatsink region of a substrate (e.g., a PCB, a ceramic substrate, or a metallic base flange) to which the die is mounted (herein, the "die support substrate"). The heatsink region may make-up the entirety of the die support substrate when the die support substrate is wholly composed of one or more thermally-conductive materials, as in the case of a metallic base flange of the type commonly incorporated into power amplifier packages. Alternatively, the heatsink region may constitute only a limited portion of the die support substrate when, for example, the substrate assumes the form of a PCB, a ceramic substrate, a coreless substrate, or a similar substrate principally composed of a dielectric material. In this latter case, the heatsink region (or regions) of the die support substrate may be realized as region(s) of the substrate having an increased metal content as created by, for example, forming a thermal via structure (e.g., bar vias or a via farm) within the body of the die support substrate or by installing a prefabricated metal body, such as a copper (Cu) coin or slug, within a cavity formed in the substrate.

Regardless of the particular form assumed by the substrate heatsink region(s), conventional heat dissipation solutions remain limited in their heat dissipation capabilities. As indicated above, existing heat dissipation solutions typically rely upon conduction of excess heat flow along a primary heat extraction path extending through the bulk of an RF power die, through the bond layer attaching the die to the die support substrate, and ultimately to the heatsink region or regions of the die support substrate. While relatively direct and non-tortuous, such a primary heat extraction path is limited in its ability to efficiently conduct large quantities of heat away from the RF power die. This is due, in part, the extension of such a primary heat extraction path through regions of lower thermal conductivity, particularly through the thickness or bulk of the RF power die itself. The limited thermal performance of this path may be exacerbated in instances in which a layered (e.g., gallium nitride (GaN)) die technology is employed due not only to the high power density of the transistor integrated circuit (IC), but also due to the lower thermal conductivity of materials (e.g., silicon carbide (SiC)) on which the GaN layer(s) are formed. Additionally, such a heat extraction path also passes through multiple material-to-material interfaces (as formed between the backside of the RF power die, the bonding material, and the die support substrate), further impeding efficient heat flow from the RF power die to the heatsink region or regions of the substrate. Alternative heat dissipation solutions have been suggested in which an RF power die (or other semiconductor die) is mounted to a die support substrate in an inverted orientation, while a high thermal conductivity material (e.g., a strip of a pyrolytic graphite sheet (PGS)) placed over the backside of the die such that the PGS strip extends from the die backside to contact thermally-conductive regions of the substrate. While potentially enhancing heat dissipation from the inverted die, such a solution again relies upon excess heat extraction through the bulk of the semiconductor die and through any thermally-conductive bond layer utilized to attach the PGS strip to the backside of the die, thus encountering the thermal performance limitations mentioned above. As a further drawback, such an approach tends to add undesirable complexity and cost to the overall design of a power amplifier device.

The following discloses high thermal performance power amplifier devices (e.g., power amplifier packages and PAMs) and methods for fabricating such high thermal performance power amplifier devices, which provide highly effective extraction and dissipation of excess heat generated by RF power dies during device operation. Embodiments of the power amplifier devices incorporate unique frontside heat extraction structures, which serve as high thermal conductivity bridges or conduits providing highly efficient heat flow from regions adjacent the transistor or transistors formed in a given RF power die to the one or more thermally-conductive heatsink regions of a die support substrate. More specifically, such frontside heat extraction structures extract excess heat from locations adjacent (e.g., directly above) the channel or channels of a transistor IC formed in a given RF power die, while transporting such excess heat to one or more heatsink regions of a die support substrate. In so doing, such frontside heat extraction structures bring about significant reductions in local transistor channel temperatures (reductions in both peak temperatures and average temperature distributions across the channel region(s) of a given RF power die) that may otherwise occur during power amplifier device operation. For this reason, embodiments of the high thermal performance power amplifier devices described herein are well-suited for usage in conjunction with RF power dies operated at higher radio frequencies (e.g., frequencies approaching or exceeding 3 Gigahertz (GHz)) and RF power dies produced utilizing power dense (e.g., GaN) die technologies.

Embodiments of the frontside heat extraction structure include a portion or section, herein the "transistor-overlay portion," which extends over the frontside of an RF power die to vertically overlap at least one transistor formed in the RF power die. The transistor-overlay portion of the frontside heat extraction structure is beneficially placed in direct thermal contact with the frontside of the RF power die, while vertically overlapping at least a portion, if not the entirety or substantial entirety of the channel region of the transistor. Such a structural arrangement enables highly targeted extraction of excess heat from regions within and adjacent the transistor channel, while allowing such heat flow to travel along a primary heat extraction path bypassing the bulk of the RF power die and the die backside attached to the die support substrate. Further, the transistor-overlay portion of the frontside heat extraction structure is composed of a material having a high thermal conductivity, as taken along a thermal path (the primary heat conduction path) extending from the frontside of the RF power die, through the frontside heat extraction structure, and to at least one heatsink region of the die support substrate. In embodiments, the transistor-overlay portion of the frontside heat extraction structure may have a thermal conductivity thermal conductivity exceeding 100 W/mk, a thermal conductivity exceeding 500 W/mk, or perhaps a thermal conductivity exceeding 1000 W/mk, as taken along the primary heat extraction path. Materials having such high thermal conductivities (at least in the desired direction of heat flow) and suitable for usage in forming the transistor-overlay portion of the frontside heat extraction structure include, but are not limited to, materials containing allotropes of carbon, such as graphite, graphene, and carbon nanotubes (CNTs). In embodiments, the transistor-overlay portion (and, perhaps, the entirety of the frontside heat extraction structure) can be composed of thermally conductive materials having anisotropic thermal conduction properties, such as PGS materials, providing that such materials are sufficiently thermally conductive along the primary heat extraction path to enable efficient heat flow.

The frontside heat extraction structure further includes at least one heatsink coupling portion. In many instances, the frontside heat extraction structure will include two heatsink coupling portions, which are coupled to (e.g., are integrally formed with or placed in direct thermal contact with) opposing edges of the transistor-overlay portion and extend therefrom in opposing directions. For this reason, the frontside heat extraction structure will typically be described as having multiple heatsink coupling portions herein; however, it is viable for the frontside heat extraction structure to include a single heatsink coupling portion or, perhaps, three or more discrete heatsink coupling portions in alternative implementations of the below-described power amplifier devices. As indicated above, the heatsink coupling portion or portions of the frontside heat extraction structure serve as thermal bridges, which thermally coupling the transistor-overlay portion to the heatsink region or regions of the die support substrate. Accordingly, the heatsink coupling portions are likewise composed of a material having a relatively high thermal conductivity, such as a thermal conductivity exceeding 100 W/mk, taken along the primary heat extraction path. Depending upon the manner in which the frontside heat extraction structure is fabricated, the heatsink coupling portions and the transistor-overlay portion may be integrally formed as a single piece or strip of a thermally-conductive material (e.g., a PGS strip) or a more complex structure (e.g., a flattened heat pipe) such that the respective thermal conductivies of the heatsink coupling portions and the transistor-overlay portion are substantially equivalent. In other instances, the heatsink coupling portions and the transistor-overlay portion may be fabricated separately and, perhaps, may be composed of materials having disparate thermal conductivity. For example, in one approach further described below in connection with FIGS. 13 and 14, the heatsink coupling portions may be deposited onto the sidewalls of an RF power die prior to application of the transistor-overlay portion over the frontside of the die whether by deposition or application of performed piece, such as a strip of material, adhered to the die frontside.

The frontside heat extraction structure may be joined to the frontside of the RF power die utilizing a thermally-conductive bonding material in certain embodiments of the power amplifier device. In other implementations, the frontside heat extraction structure may not be directly bonded to the RF power die, but rather captured against the frontside of the RF power die (and against the heatsink region(s) of the substrate) utilizing a mechanical device or "retention clip;" the term "retention clip," as appearing, utilized in a general sense to denote any device or structure capturing a frontside heat extraction structure over and against at least one RF power die. Such a retention clip may capture the frontside heat extraction structure in a desired position over the RF power die, perhaps while exerting a resilient bias force pressing or urging the transistor-overlay portion of the frontside heat extraction structure against frontside of the RF power die. In so doing, the retention clip promotes uniform, conformal contact along the entirety or the substantial entirety of the interface between the transistor-overlay portion of the frontside heat extraction structure and the frontside of the RF power die without the usage of an intervening thermally-conductive bonding material. This may be advantageous for at least two reasons. First, the elimination any such bonding material at this interface may enhance thermal conductivity from the RF power die to the transistor-overlay portion of the frontside heat extraction structure as the thermal conductivity of the bonding material will typically be less than that of the frontside heat extraction structure itself. Also, thermal conductivity along the primary heat extraction path can be enhanced in this case by reducing the number of material-to-material interfaces through which the primary heat extraction path extends. Second, elimination of a thermal-conductive bonding material at the interface between the transistor-overlay portion of the frontside heat extraction structure and the frontside of the RF power transistor may alleviate concerns regarding the potential gradual breakdown or decomposition of the bonding material over time. Such benefits notwithstanding, in other instances, the transistor-overlay portion may be bonded to the RF power die and a retention clip may be utilized to, for example, provide a level of redundancy should the bonding material degrade and ultimately fail for any reason. The above statements are also equally applicable to the heatsink coupling portions of the frontside heat extraction structure; e.g., the retention clip (if present) may also mechanically capture the heatsink coupling portions against the heatsink region (or regions) of the substrate and/or a thermally-conductive bonding material may be utilized at these interfaces.

In still other implementations, the power amplifier device may contain a frontside heat extraction structure, while lacking a retention clip or other auxiliary component for capturing the heat extraction structure against the RF power die. In certain embodiments in which a retention clip (or another mechanical retention means) is omitted from the power amplifier device, it may be beneficial to separately fabricate the transistor-overlay portion and the heatsink coupling portions of the frontside heat extraction structure from the same or different materials during production of the power amplifier device. As a specific example, the heatsink coupling portions may be deposited onto one or more sidewalls of the RF power die during wafer level processing, while the transistor-overlay portion is subsequently applied (e.g., by deposition or by adherence of a thin film) over the frontside of the RF power die. Further, process efficiency may be enhanced by depositing the heatsink coupling portions onto the die sidewalls during wafer level processing. In particular, in one possible approach, vertical openings or through-holes are initially formed through targeted regions of a wafer containing interconnected RF power dies. The vertical openings are formed to penetrate selected outer peripheral sidewalls of the RF power dies, possibly while imparting the die sidewalls with slotted or crenulated geometries upon wafer singulation. Prior to wafer singulation, and perhaps in conjunction with plating of any vias further contained in the RF power dies, a metallic material (e.g., a material containing Cu, silver (Ag), aluminum (Al), or gold (Au), or a combination thereof as primary constituents, by weight) is deposited into the vertical openings (e.g., the recesses of the crenulated sidewalls) to define the heatsink coupling portions when cleaved from the rest of the wafer upon singulation. Prior to or following wafer singulation, the transistor-overlay portions of the frontside heat extraction structures are then applied over the frontside of each RF power die. In this manner, each transistor-overlay portions is placed in direct thermal contact with the frontside of the corresponding RF power die and may be composed of a material (e.g., a material containing an allotrope of carbon, such as graphite, graphene, or CNTs) having a thermal conductivity exceeding that of the heatsink coupling portions, as taken along the primary heat extraction path extending from the RF power die, through the frontside heat extraction structure, and to the heatsink region or regions of the substrate.

Examples of power amplifier devices including frontside heat extraction structures, and examples of methods for fabricating such devices, will now be described in connection with FIGS. 1-14. Examples of power amplifier devices including such heat extraction structures and retention clips (as well as associated fabrication methods) are specifically discussed below in connection with FIGS. 1-8, while examples of power amplifier devices including such heat extraction structures and lacking retention clips are set-forth in connection with FIGS. 11-14. Simulation results demonstrating the effectiveness of the frontside heat extraction structures in reducing local channel temperatures are also discussed in connection with FIGS. 9 and 10. While principally described below in conjunction with a particular type of power amplifier device (namely, a power amplifier package containing a substrate in the form of a base flange, the entirety of which may serve as a heatsink), it is emphasized that embodiments of frontside heat extraction structures can be integrated into various different types of power amplifier devices including, for example, PAMs fabricated utilizing PCBs, ceramic substrates, or other types of substrates having discrete thermally-conductive heatsink regions formed by embedded metal coins, thermal via structures, or other thermally-conductive structures.

Figure 2:
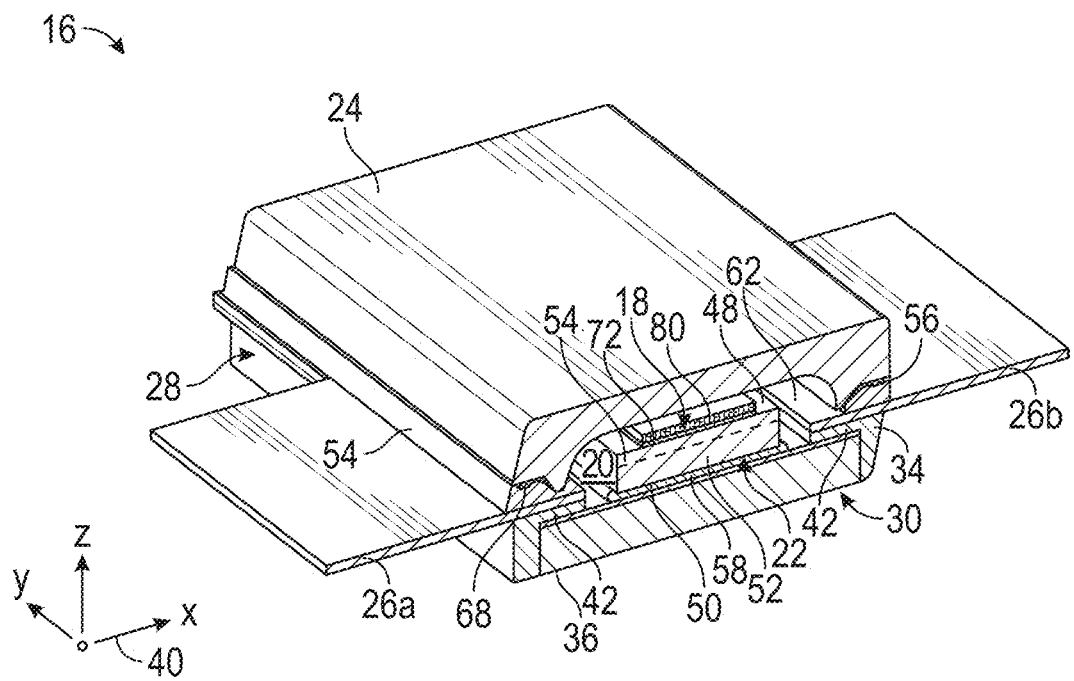

Examples of Power Amplifier Devices Including Frontside Heat Extraction Structures and Retention Clips FIGS. 1 and 2 are simplified cross-sectional and cross-sectional isometric views, respectively, illustrating an example power amplifier device (here, a power amplifier package 16) including a frontside heat extraction structure 18, as depicted in accordance with an example embodiment of the present disclosure. In this particular example, power amplifier package 16 assumes of the form of a molded air cavity package containing an air cavity 20 in which at least one RF power die 22 is housed. While referred to as an "air cavity" by industry convention, air cavity 20 may contain air, another inert gas, or a gas mixture, which may be partially evacuated or pressurized relative to the ambient environment. The present example notwithstanding, power amplifier package 16 may assume various other forms in alternative implementations, such as an encapsulated or over-molded package lacking a gas-containing cavity, an air cavity package constructed utilizing a non-mold (e.g., window frame) approach, and/or a package containing a disparate lead configuration, such as a no-lead package or a gullwing package. Additionally, while the illustrated portion of power amplifier package 16 includes only a single RF power die, it will be appreciated that power amplifier package 16 can contain multiple RF power dies and various other circuitry components including, but not limited to, any number of passive surface mount devices (SMDs), semiconductor dies bearing circuitry providing other functionalities (e.g., impedance matching, harmonic termination, or transistor biasing functionalities), and package-embedded routed substrates (e.g., a relatively small, package-embedded PCB) in embodiments. As a specific, albeit non-limiting example, power amplifier package 16 may assume the form of a Doherty power amplifier package in embodiments. In such embodiments, power amplifier package 16 will typically contain at least a first RF power die carrying a single stage or multi-stage peaking amplifier transistor IC and at least a second RF power die carrying a single stage or multi-stage carrier amplifier transistor IC. In such embodiments, each RF power die may be furnished with a frontside heat extraction structure, only a single RF power die (e.g., the peaking die) may have such a heat extraction structure, or a single heat extraction structure may span both dies.

In addition to frontside heat extraction structure 18, power amplifier package 16 includes an upper lid or cover piece 24, a plurality of package leads 26 (two of which can be seen in FIGS. 1 and 2), a molded package body 28, and a supportive base structure or die support substrate 30. Die support substrate 30 assumes the form of a metallic base flange in the illustrated example and is consequently referred to hereafter as "base flange 30." Due to its metallic composition, the entirety or substantial entirety of base flange 30 may serve as a heatsink; thus, the thermally-conductive heatsink region of base flange 30 may be considered the entire body of base flange 30 in this particular example. In other embodiments, however, power amplifier package 16 (or another power amplifier device) may be fabricated utilizing a substrate predominately composed of a thermally-insulative dielectric material as in the case of a PCB, a ceramic substrate, or a coreless substrate, to list but a few examples. Further, in such embodiments, the substrate may be produced to include one or more thermally-conductive components or sections serving as the heatsink region(s) to which the below-described heatsink coupling portions of frontside heat extraction structure 18 are thermally coupled. The following description, then, should be understood as applicable to power amplifier devices containing various different types of die support substrates, providing that at least one region of the substrate (if not the entirety of the substrate) has a thermal conductivity and a volume of thermally-conductive material (e.g., a metal density) sufficient to act as heatsink or thermal conduit, with the heatsink absorbing excess heat extracted from at least one RF power die (e.g., RF power die 22 in the present example embodiment) and possibly further conducting such excess heat to a larger assembly-level heatsink or heat spreader. In this latter regard, and again addressing package 16 specifically, an exposed lower surface of base flange 30 may be placed in direct thermal contact with or otherwise thermally coupled to an assembly-level heatsink component (e.g., a metal chassis, a fin array, or another convectively-cooled structure) when power amplifier package 16 is ultimately installed within a larger electronic assembly or system, as further mentioned below.

When included in package 16, molded package body 28 can be formed to have various different structural features including a bottom edge portion or lower peripheral skirt 34. As noted above, the terms "lower," "bottom," "upper," "top," and similar terms of orientation defined based upon proximity to a lower principal surface or backside 36 of base flange 30. Backside 36 of base flange 30 is, in turn, defined as a principal surface of base flange 30 opposite the frontside or die support surface 46 of base flange 30, with flange backside 36 extending substantially orthogonal to a vertical axis or centerline 38 of power amplifier package 16 (FIG. 1). Lower peripheral skirt 34 is bonded to and extends around base flange 30 as taken about centerline 38, which extends parallel to the Z-axis of coordinate legend 40 appearing in the lower left corner of FIGS. 1 and 2. Backside 36 of base flange 30 is exposed through a lower central opening provided in molded package body 28 and peripherally bound by lower peripheral skirt 34. By exposing flange backside 36 from the exterior or underside of power amplifier package 16, installation of power amplifier package 16 within a larger electronic system or assembly may be eased, while electrical connection to flange backside 36 may be facilitated when, for example, base flange 30 serves as a (e.g., ground) terminal of package 16. The exposed region of flange backside 36 may also promote heat removal from power amplifier package 16 by conductive heat transfer through base flange 30, as previously indicated. Finally, in addition to peripheral skirt 34, molded package body 28 may also be formed to define various other package features, such as lead isolation shelves 42. Lead isolation shelves 42 extend beneath inner terminal end or edge portions of package leads 26 to serve, in effect, as intervening dielectric layers providing electrical isolation between package leads 26 and base flange 30.

With continued reference to FIGS. 1 and 2, RF power die 22 includes a frontside 48 and a backside 50 located opposite frontside 48 as taken along the centerline of RF power die 22; that is, an axis extending orthogonal to frontside 48. In certain embodiments, such as when backside 50 serves as a (e.g., ground) terminal of RF power die 22, backside 50 of RF power die 22 may be metalized (that is, at least partially covered by one or more metallic layers), in which case backside 50 may be referred to as the "backmetal" layer or system of die 22. In addition to the RF power transistor itself, an RF power die includes a die body or structure over which a number of frontside layers are produced. This is generically illustrated in FIG. 2 for RF power die 22, which depicts RF power die 22 as including a die body 52 over which a number of frontside layers 54 are fabricated. Die body 52 can be composed of a single semiconductor material when, for example, RF power die 22 is produced utilizing a singulated piece of a bulk silicon (Si) wafer. Alternatively, die body 52 can be composed of multiple layers of disparate materials including at least one layer or body of a semiconductor material. In this latter regard, in implementations in which RF power die 22 is produced utilizing a layered (e.g., GaN) die technology, an upper portion of die body 52 may be essentially or predominantly composed of a first semiconductor material (e.g., GaN) by weight, while a lower portion of die body 52 is composed of another material (or combination of materials), such as SiC or Si, on which the first semiconductor (e.g., GaN) layer is formed. In either instance, a transistor channel region 56 (identified in FIG. 1) is formed in a semiconductor region of die body 52 at a location immediately below frontside layers 54 (noting that the transistor channel may be buried slightly below the upper principal surface of the semiconductor region). The transistor itself is formed both in and above the semiconductor region of die body 52, with certain portions of the transistor (e.g., the drain lines, drain manifold, gate contact fingers, and gate manifold in the case of a field effect transistor (FET)) defined by a first patterned metal layer included in frontside layers 54. Frontside layers 54 also include additional patterned metal layers defining a number of bond pads 60 and interconnect lines, dielectric layers for providing isolation between the features of the patterned metal layers, and perhaps an outer passivation layer at least partially defining frontside 48 of RF power die 22.

RF power die 22 is attached to die support surface 46 of base flange 30 by at least one die bond layer 58. Die bond layer 58 may be composed of a thermally-conductive material, such as a sintered bond material or a metal-filled (e.g., Cu-filled or Ag-filled) epoxy, to supplement conductive heat transfer from RF power die 22 to base flange 30 in at least some implementations. Further, when base flange 30 serves as a (e.g., ground) terminal of power amplifier package 16, die bond layer 58 may also be electrically conductive to provide an electrical connection between base flange 30 and electrically-conducive features (e.g., vias) located on or extending to backside 50 of RF power die 22. Further electrical interconnection of RF power die 22 is accomplished utilizing a number of bond pads 60 provided on frontside 48 of RF power die 22. For example, and as shown exclusively in FIG. 1, two rows of bond pads 60 may be present on frontside 48 of RF power die 22 and electrically interconnected with exposed inner portions 62 of package leads 26 utilizing a number of wire bonds 64. In alternative implementations, another interconnection approach may be employed to electrically interconnect bond pads 60 of RF power die 22 with the corresponding package terminals. Regardless of the interconnection approach employed, the following electrical wiring scheme may apply in the illustrated example in which RF power die 22 carries at least one FET IC. A first lead 26(a), which projects from a first side of power amplifier package 16, may serve as an input lead electrically coupled to the input (e.g., gate) terminal of RF power die 22; while a second lead 26(b), which project from a second, opposing side of package 16, may serve as an output lead electrically coupled to the output (e.g., drain) terminal of RF power die 22. Base flange 30 may itself serve as a ground terminal of power amplifier package 16 and, therefore, may be electrically coupled to a source terminal of RF power die 22.

While only a single RF power die 22 is visible in the illustrated portion of package 16, power amplifier package 16 can contain any number and type of microelectronic devices or components operably coupled utilizing various interconnection schemes, as previously mentioned. For example, in certain implementations, power amplifier package 16 may contain two or more RF power dies 22 electrically coupled in series or parallel between any practical number of package leads. As a more specific example in which package 16 assumes the form of a Doherty PA package, power amplifier package 16 contain a first transistor-bearing semiconductor die (e.g., RF power die 22) serving a peaking die bearing a peaking transistor IC and electrically coupled between package leads 26(a), (b). In this case, power amplifier package 16 may further contain a second semiconductor die serving as a carrier die bearing a carrier transistor IC and electrically coupled between additional sets of package leads hidden from view in the illustrated cross-sections. In such embodiments, frontside heat extraction structure 18 may extend over the additional non-illustrated semiconductor die (or dies) contained in power amplifier package 16 in addition to RF power die 22. Alternatively, separate frontside heat extraction structures may be provided for each die; or, perhaps, only for selected die(s) prone to excess heat generation and accumulation in the transistor channel regions. Regardless of whether power amplifier package 16 contains additional microelectronic components in addition to RF power die 22, such components are mounted within air cavity 20 by bonding to die support surface 46 of base flange 30 during package manufacture. Interconnection is performed (e.g., by wire bonding), and cover piece 24 is then installed over an upper peripheral edge portion 66 of package body 28 to sealingly enclose air cavity 20; e.g., as indicated in FIGS. 1 and 2, the lower peripheral edge of cover piece 24 may be attached to upper peripheral edge portion 66 of molded package body 28 by a ring of bond material 68 to yield a substantially gas-tight seal around the periphery of the cover-body interface of package 16.

Figure 3:
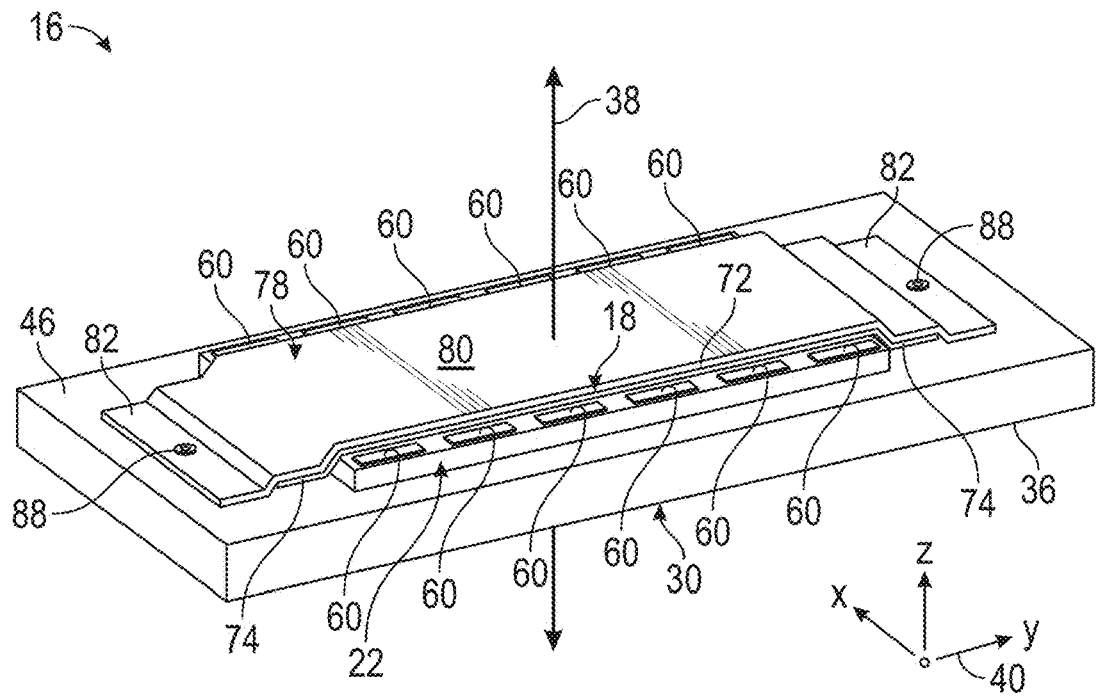
FIGS. 3 and 4 are isometric and exploded views, respectively, of the frontside heat extraction structure, the retention clip, a radio frequency (RF) power die, and a portion of a base flange included in the example power amplifier device shown in FIGS. 1 and 2.
Figure 4:
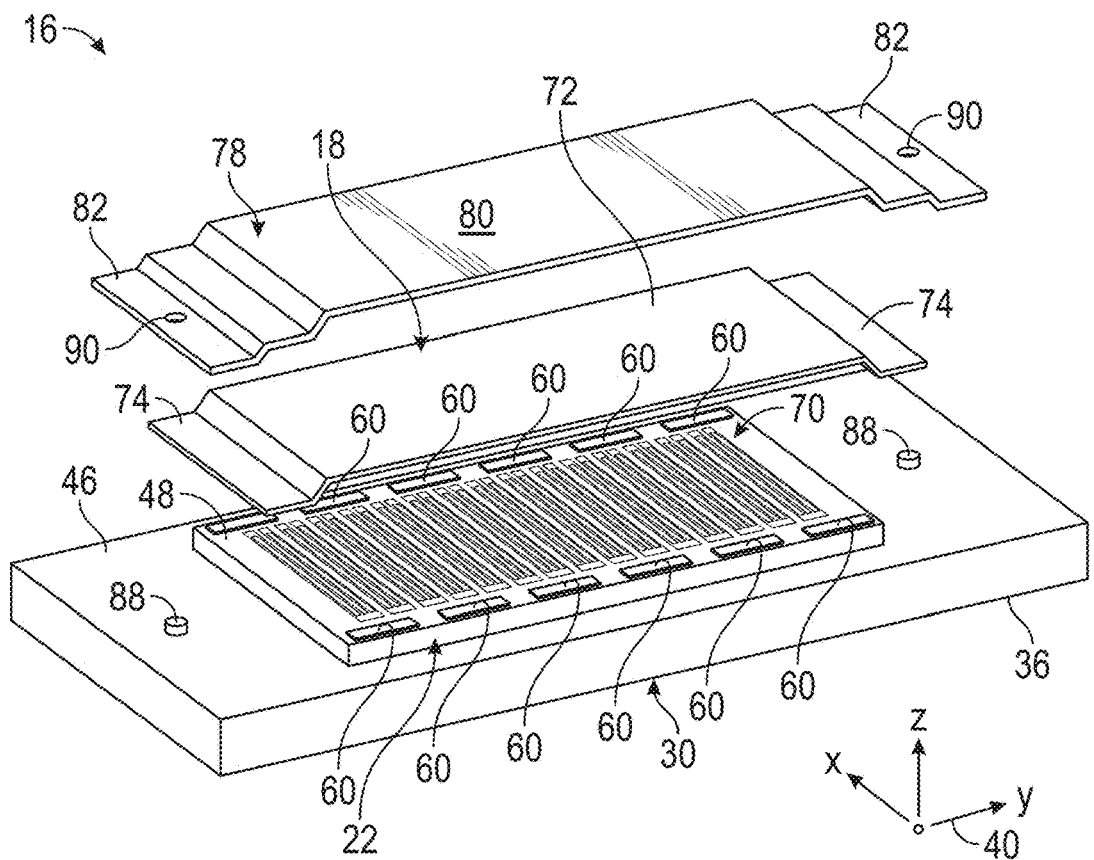
Figure 5:
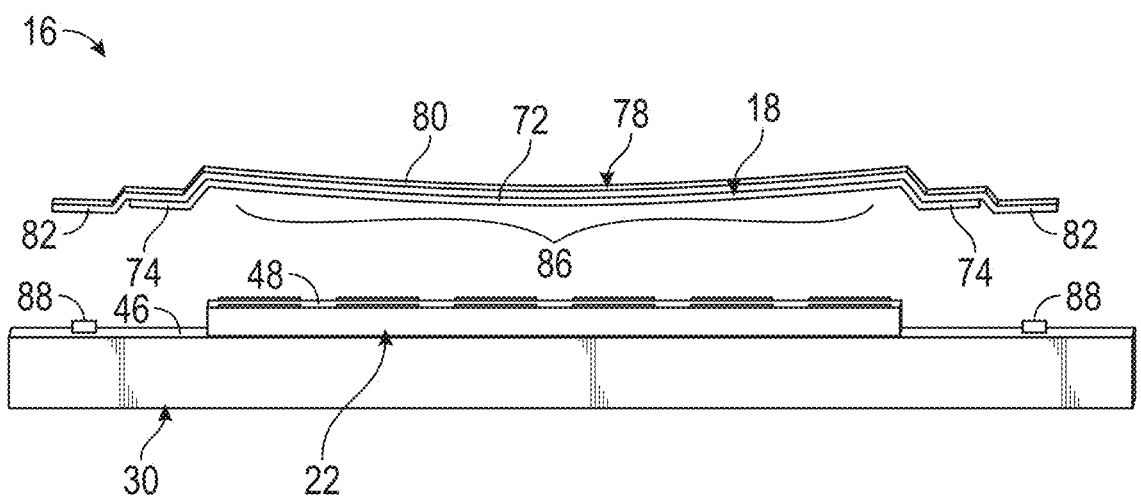
FIG. 5 is a side view of the example frontside heat extraction structure, the retention clip, the RF power die, and the base flange (partially shown) of FIGS. 1-4 illustrating one manner in which the retention clip may be pre-bent or otherwise shaped to exert a resilient bias force pressing the frontside heat extraction structure against the frontside of the RF power die (or dies) contained in the power amplifier package shown in FIGS. 1 and 2.

Turning now to FIGS. 3 and 4, frontside heat extraction structure 18 and other surrounding components of power amplifier package 16 will now be described in greater detail. For purposes of illustration, a FET transistor structure 70 (hereafter, "FET 70") is generally depicted as formed beneath frontside 48 of RF power die 22 in the exploded view of FIG. 4. In this example, FET 70 is imparted with a comb-type or interdigitated transistor finger arrangement formed by a number of elongated drain lines (extending from a drain manifold), which are interspersed or interleaved with a number of gate contact fingers (extending from a gate manifold laterally opposite the drain manifold). Such electrically-conductive features of FET 70 are defined by patterning of an initially-deposited metal layer (commonly referred to as the "Ml" layer) included in frontside layers 54 (FIG. 2). The source and drain regions of FET 70 are further defined by doping selected regions of the semiconductor material contained in or composing die body 52 (FIG. 2); e.g., as seen looking downwardly onto the principal surface of the semiconductor region in which the channel of FET 70 is formed, each source region may be located between or laterally bordered by two drain lines and two underlying drain regions, which are, in turn, located between by two of the gate contact fingers. Various other transistor configurations are possible in further implementations. Additionally, while illustrated as a single transistor stage in the present example, further embodiments of RF power die 22 may include multiple FETs (or another transistor type) collectively forming a multi-stage amplifier. When including at least one FET, such as FET 70, the FET can be implemented utilizing any of the following die technologies: a silicon-based FET (e.g., a laterally-diffused metal oxide semiconductor FET or LDMOS FET) or a III-V FET (e.g., a GaN FET, a gallium arsenide (GaAs) FET, a gallium phosphide (GaP) FET, an indium phosphide (InP) FET, or an indium antimonide (InSb) FET, or another type of III-V transistor). Finally, alternative embodiments of power amplifier package 16 can be implemented utilizing other transistor types including, but not limited to, bipolar transistors.

Frontside heat extraction structure 18 includes a transistor-overlay portion 72 and one or more one heatsink coupling portions 74. As indicated by the term "overlay," transistor-overlay portion 72 vertically overlaps at least a portion, if not the substantial entirety of the FET 70 and, specifically, the transistor channel region (channel region 56 in FIG. 1) as taken along vertical axis or centerline 38 of power amplifier package 16 (again, extending parallel to the Z-axis of coordinate legend 40 appearing in FIGS. 1-4). The degree to which transistor-overlay portion 72 vertically overlaps with the channel of FET 70 will vary between embodiments. In certain implementations, the transistor-overlay portion 72 overlaps at least a majority, if not the entirety or substantial entirety of the channel of FET 70 by surface area, as taken along centerline 38. Further, transistor-overlay portion 72 may longitudinally span the length of channel of FET 70 and, perhaps, the length of RF power die 22 in embodiments, as taken along the Y-axis of coordinate legend 40 (also referred as the "longitudinal axis" of power amplifier device 16.) Generally, the planform shape and dimension of transistor-overlay portion 72 may be determined by the shape and dimensions of RF power die 22, as well as other packaging constraint considerations including the location of any bond pads or other electrically-conductive features located on frontside 48 of RF power die 22. In the illustrated example, transistor-overlay portion 72 of frontside heat extraction structure 18 extends between and substantially parallel to the rows of bond pads 60 spaced along the longitudinal edges of frontside 48 such that the bond pad rows 60 flank transistor-overlay portion 72, as shown most clearly in FIG. 3. A lateral standoff or spacing is provided between bond pads 60 and the neighboring edges of transistor-overlay portion 72 to avoid obstructing wire-bonding to bond pads 60, while also preventing electrical bridging in embodiments in which transistor-overlay portion 72 is electrically conductive. Also, in instances in which transistor-overlay portion 72 is composed of an electrically-conductive material, electrical isolation between side heat extraction structure 18 and the other electrically-conductive features of the transistor IC integrated into RF power die 22 may be provided by one or more dielectric (e.g., passivation) layers, which are formed over the body of die 22 and included in frontside layers 54, as previously described. Finally, while transistor-overlay portion 72 has a relatively simple rectangular planform shape in the illustrated embodiment, the geometry of transistor-overlay portion 72 can be more complex or contoured in further embodiments of power amplifier package 16.

As is transistor-overlay portion 72 of frontside heat extraction structure 18, heatsink coupling portions 74 are formed from a material having a relatively high thermal conductivity, such as a thermal conductivity exceeding 100 W/mk, as taken along the primary heat extraction path extending from transistor-overlay portion 72 of frontside heat extraction structure 18, through heatsink coupling portions 74 (as extending in either direction from portion 72 along the Y-axis of coordinate legend 40), and to the locations at which heatsink coupling portions 74 contact or are otherwise are joined to base flange 30. In illustrated example, heatsink coupling portions 74 of frontside heat extraction structure 18 extend from opposing edges of transistor-overlay portion 72 at a downward angle toward die support surface 46 of base flange 30. The lower terminal ends of heatsink coupling portions 74 may be placed in direct thermal contact with die support surface 46 of base flange 30 or, stated more generally, with the heatsink region(s) of the die support substrate to which the RF power die 22 is attached. Accordingly, and with reference to the example of FIGS. 1-4, heatsink coupling portions 74 may be bonded to die support surface 46 of base flange 30 utilizing a thermally-conductive bonding material, such as metal-filled epoxy, a sintered material, a solder (solder paste or solder finish), or a thermally-conductive die attach material, in embodiments. Alternatively, heatsink coupling portions 74 may be physically pressed against or held in an abutting (physically contacting) relationship with die support surface 46 utilizing, for example, a retention clip of the type described below.

As indicated above, heatsink coupling portions 74 and transistor-overlay portion 72 may be integrally formed as a unitary body of material or a single pre-fabricated component in embodiments. In other instances, heatsink coupling portions 74 and transistor-overlay portion 72 may be separately formed and possibly composed of different materials having disparate thermal conductivities, as further discussed below in connection with FIGS. 10-14. In the example of FIGS. 1-4, specifically, heatsink coupling portions 74 and transistor-overlay portion 72 are integrally formed as a single layer or strip of a high thermal conductivity material 72, 74; the term "high thermal conductivity material" referring to a material having a thermal conductivity approaching or exceeding 100 W/mk and, perhaps, approaching or exceeding 1000 W/mk in at least some instances. Suitable materials and composites include diamond polycarbonate materials, diamond-metal composites (e.g., diamond Au, diamond Ag, and diamond Cu), pyrolytic graphite, and materials containing allotropes of carbon, such as graphene, graphite, and CNT-filled materials. In a specific embodiment, frontside heat extraction structure 18 is realized utilizing a freestanding, flexible strip of a PGS material, which is retained over RF power die 22 by a retention clip 78, as shown in FIGS. 1-4 and described more fully below. In other implementations, frontside heat extraction structure 18 may have a more complex three dimensional form, such as that of a flat (e.g., wire) braid woven from high thermal conductivity filaments. As a still further possibility, frontside heat extraction structure 18 may assume the form of a specialized heat pipe in embodiments; e.g., a heat pipe having flat lower surfaces suitable for conformally contacting or being bonded to frontside 48 of RF power die 22 and die support surface 46 of base flange 30. Notably, in this latter regard, the casing of the heat pipe (again, serving as frontside heat extraction structure 18 in this example) can be extended beyond the edges of the heat pipe's hermetic chamber by some extent to allow joinder of the heat pipe's end portions to base flange 30 in a manner analogous to that described below in conjunction with the foot sections of retention clip 78.

In embodiments, frontside heat extraction structure 18 may have a thickness (taken along the Z-axis of coordinate legend 40) less than 160 microns (μm), preferably less than 100 μm, and more preferably less than 50 μm. In one specific, albeit non-limiting example, frontside heat extraction structure 18 is formed from a strip of PGS material having a thickness of between about 10 and about 25 μm and a thermal conductivity in the X-Y plane (hereafter, a "planar heat conductivity") exceeding 1500 W/mk. The heat conductivity of such a PGS material may be significantly less taken through its thickness (along the Z-axis of coordinate legend 40), noting that such PGS materials generally have anisotropic thermal conduction properties; however, this is generally inconsequential in the illustrated example as the primary heat conduction path from frontside heat extraction structure 18 to base flange 30 extends purely or essentially along the length and width of heat extraction structure 18. Due to such anisotropic thermal properties, the thermal conductivity of the in the X-Y plane may decrease with increasing thickness over a certain range. Accordingly, a tradeoff is encountered in which the usage of such a PGS sheet (or a similar thermally-conductive material) is ideally selected to maximize thermal conductivity along the primary heat extraction path, while meeting practical concerns, such as material strength. In other embodiments, frontside heat extraction structure 18 may be thicker or thinner than the aforementioned ranges. More generally, frontside heat extraction structure 18 will often have an average or global thickness less than that of RF power die 22, while having a thermal conductivity (as taken along the above-described primary heat extraction path) at least twice, if not 10 times the thermal conductivity of RF power die 22 taken through its thickness (that is, along the Z-axis of coordinate legend 40).

With continued reference to example embodiment of FIGS. 1-4, a retention clip 78 may be beneficially utilized to capture frontside heat extraction structure 18 in its desired position over base flange 30 and against RF power die 22. When included within power amplifier device 16, retention clip 78 may physically press transistor-overlay portion 72 of frontside heat extraction structure 18 against frontside 48 of RF power die 22 in a substantially conformal, abutting relationship. Similarly, retention clip 78 may also press heatsink coupling portions 74 against base flange 30 to promote uniform, conformal contact between heatsink coupling portions 74 and die support surface 46 of base flange 30 In this manner, the provision of retention clip 78 advantageously help to ensure consistent or uniform contact over across the respective surface areas at these thermal transfer interfaces, thereby promoting efficient thermal transfer along the primary heat extraction path from RF power die 22, through heat extraction structure 18, and to base flange 30 (generically the heatsink region(s) of a die support substrate). If required or desired, one or more thermally-conductive bonding materials can be applied at any or all of these structural interfaces between frontside heat extraction structure 18, RF power die 22, and base flange 30. Alternatively, a thermally-conductive bonding material may not be provided at these interfaces to allow intimate contact between transistor-overlay portion 72 and frontside 48 of RF power die 22, to allow intimate contact between heatsink coupling portions 74 against die support surface 46 of base flange 30, or both. Such uniform contact, bond material-free thermal transfer interfaces may provide several notable benefits, as described in the following paragraph.

The provision of a conform, intimate-contact relationship at the interfaces or junctures formed between heatsink coupling portions 74 and base flange 30 and, more particularly, at the interface formed between transistor-overlay portion 72 and RF power die 22 may be advantageous for several reasons. First, through the elimination of intervening layers of bonding material, the number of material-to-material interfaces through which heat flows, when conducted along the primary conduction path from RF power die 22 to base flange 30, is minimized to reduce thermal resistivity along the primary heat extraction path or paths. Further, even when a bonding material having a relatively high thermal conductivity is present at these interfaces, such a bonding material will still typically have a thermal conductivity lower than does heatsink coupling portions 74 of frontside heat extraction structure 18 itself. Thus, elimination of bonding material at the above-mentioned interfaces can improve the lower the overall thermal resistance of the primary heat extraction path to further promote efficient heat transfer from RF power die 22 to base flange 30. Third, when utilized, thermally-conductive bonding materials can potentially decompose or otherwise breakdown over time and across repeated thermal cycling. The elimination of thermally-conductive bonding materials may thus alleviate such concerns and improve the overall reliability power amplifier package 16. These advantages notwithstanding, thermally-conductive bonding materials (e.g., metal-filled epoxies, sintered materials, thermally-conductive die attach materials, and so on) may be applied at any or all of these interfaces in further implementations. When frontside heat extraction structure 18 is bonded to base flange 30 and, perhaps, to RF power die 22, retention clip 78 may be omitted from power amplifier package 16. Alternatively, retention clip 78 may still be incorporated into power amplifier package 16 to provide redundancy should the selected bonding materials degrade or otherwise fail over time.

To provide the desired mechanical retention function, retention clip 78 includes an elongated body or midsection 80 and two flange or foot sections 82. As does transistor-overlay portion 72 of frontside heat extraction structure 18, elongated midsection 80 spans RF power die 22 taken along its length, as taken along a longitudinal axis parallel to the Y-axis of coordinate legend 40 and perpendicular to the above-described vertical axis. Additionally, elongated midsection 80 of retention clip 78 further extends over and across transistor-overlay portion 72. Transistor-overlay portion 72 is therefore located between elongated midsection 80 of retention clip 78 and frontside 48 of RF power die 22, as taken along centerline 38 or the Z-axis of coordinate legend 40 in the illustrated example. Foot sections 82 extend from opposing edges of elongated midsection 80, angling downward toward base flange 30, to provide two functions. First, foot sections 82 may be formed to physically capture or retain heatsink coupling portions 74 against base flange 30 as shown. Second, foot sections 82 are each joined to base flange 30 at one or more attachment points. In this regard, foot sections 82 may further extend past heatsink coupling portions 74 along the longitudinal axis (corresponding to the Y-axis of coordinate legend 40) to allow mechanical joinder to base flange 30. Various different joinder techniques can be employed to join foot sections 82 to base flange 30 depending upon, among other factors, the material from which retention clip 78 is formed, as described below.

Retention clip 78 may be composed of a thermally-conductive, from a non-thermally-conductive material, or a combination of materials. When composed of a thermally-conductive material, retention clip 78 may contribute somewhat to the overall heat dissipation capabilities of power amplifier package 16 by transferring some quantity of heat to base flange 36 and by serving as a small heatsink region or heat spreader; however, heat transfer from RF power die 22 to base flange 36 will occur principally through frontside heat extraction structure 18 such that selecting the material of retention clip 78 to have a relatively high thermal conductivity is generally unnecessary. Considering this, retention clip 78 may be formed from a polymer (e.g., a molded thermoplastic) or another material having a relatively low thermal conductivity in embodiments, if such a material is compatible with the operating temperatures of power amplifier package 16. In other embodiments, retention clip 78 may be composed of a metallic material, such as Cu or a Cu-molybdenum (Mo) alloy (that is, an alloy containing Cu and Mo as its primary constituents, by weight). In embodiments in which retention clip 78 is composed of a material having an inherent resiliency, retention clip 78 may be shaped to exert a compressive or clamp force pressing transistor-overlay portion 72 against RF power die 22 when retention clip 78 is installed in its desired position over die 22. For example, as indicated by bracketed region 86 in FIG. 5, elongated midsection 80 of retention clip 78 can been imparted with a bowed or gently bent shape such that elongated midsection 80 arches downwardly toward RF power die 22 prior to installation. When installed in place, elongated midsection 80 flattens against RF power die 22 and transistor-overlay portion 72 of frontside heat extraction structure 18, but continues to exert a bias force pressing transistor-overlay portion 72 against RF power die 22. Some degree of such a resilient bias force may also be applied by dimensioning the angled portions of foot sections 82 to likewise flatten (that is, move into an orientation more aligned with the X-Y plane) upon installation of retention clip 78. In other embodiments, a different spring feature can be integrally formed with retention clip 78 or such a spring feature may not be present.

Figure 6:
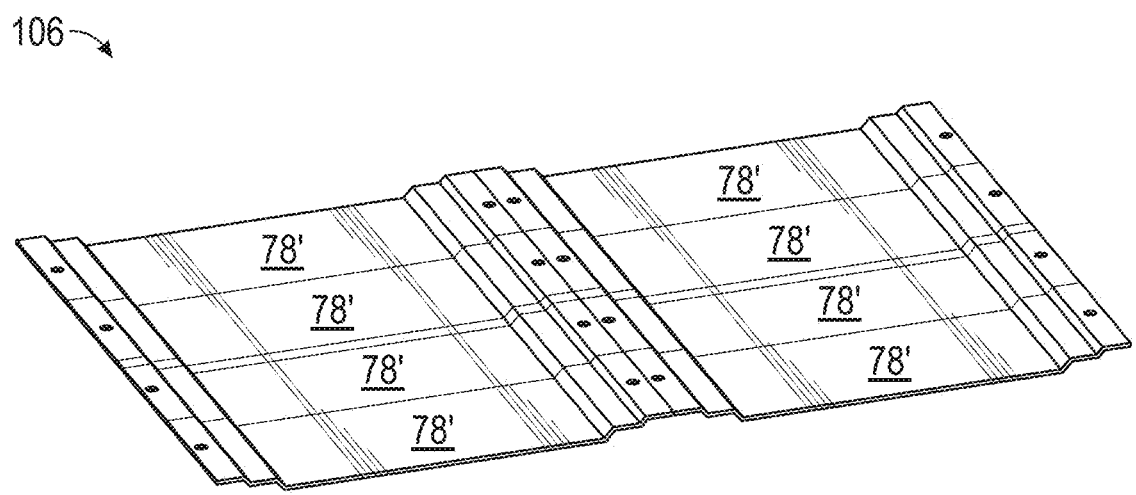
FIGS. 6 and 7 illustrate one manner in which the retention clip shown in FIGS. 1-5 can be fabricated in parallel with a plurality of other retention clips by global processing of a metallic sheet (partially shown prior to singulation)
Figure 7:
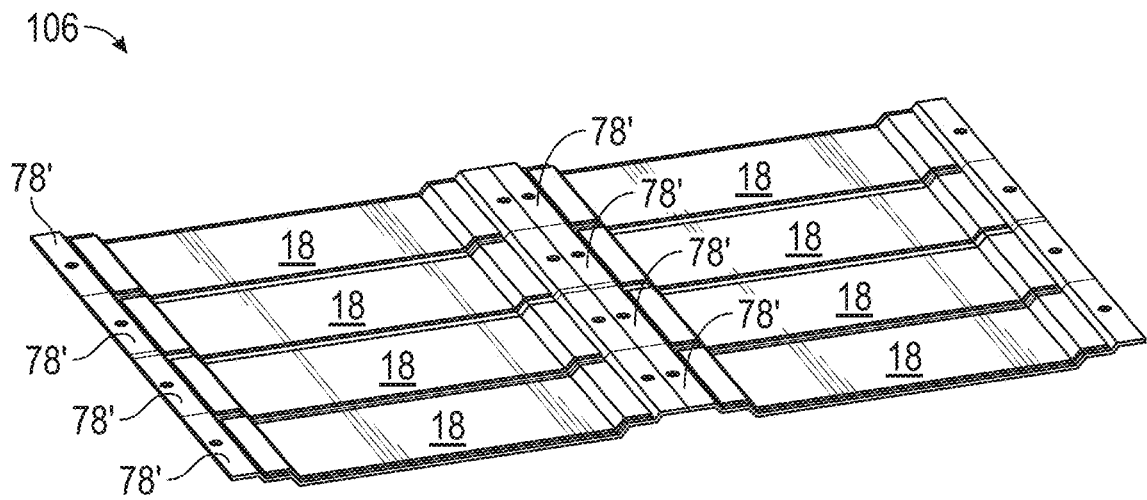
Figure 8:
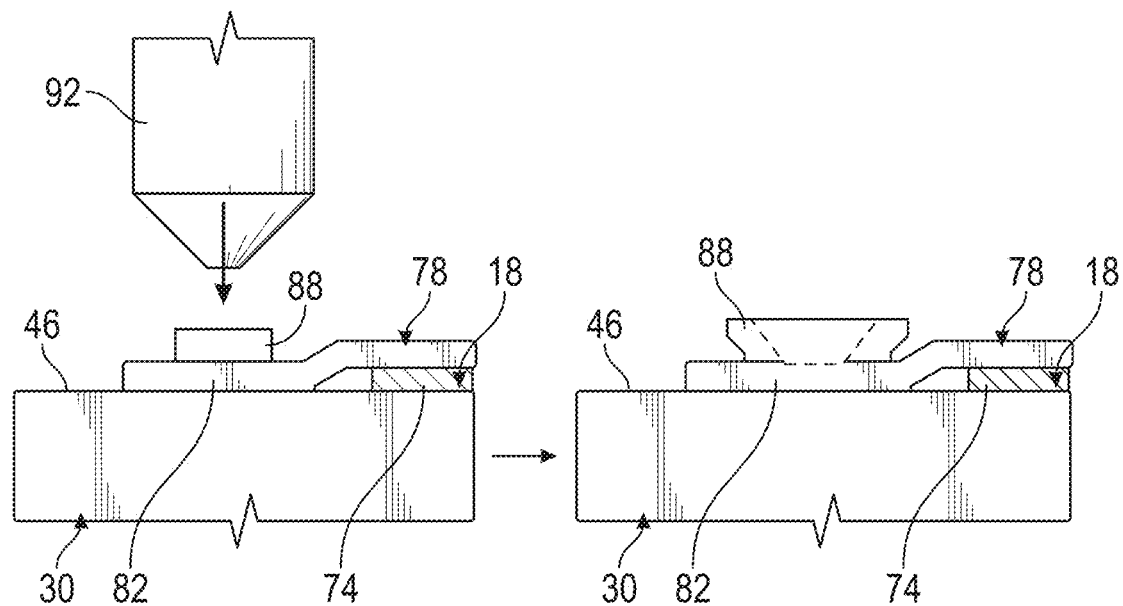
FIG. 8 illustrates, in sequence, a staking process that can be utilized to secure the retention clip to the base flange and capture the frontside heat extraction structure against the RF power die in the illustrated example.

In embodiments in which retention clip 78 is formed from a metallic material, such as a Cu or CuMo alloy, retention clip 78 can be readily produced in conjunction with a plurality of similar or identical retention clips by global processing of a metallic sheet. Further illustrating this point, FIG. 6 depicts a limited portion of such metallic sheet 106, which contains eight retention clips 78 in a pre-singulated form. As can be seen in this drawing figure, drilling, punching, or another material removal operation has been performed to define openings 90 through the respective foot sections 82 of the retention clips 78. Additionally, stamping or another metal forming process has been conducted to impart retention clips 78 with their desired three dimensional geometries. This allows each retention clip 78, when singulated, to seat or register flush against an RF power die (e.g., RF power die 22) and the die support substrate to which the RF power die is attached (e.g., base flange 30). Following the stage of manufacture shown in FIG. 6, singulation may be conducted (e.g., by sawing, laser cutting, water jetting, or using another process) to separate retention clips 78 and the other non-illustrated retention clips into individual units. Alternatively, and as indicated in FIG. 7, frontside heat extraction structures 18 may be applied the respective undersides of retention clips 78 prior to metal sheet singulation in embodiments. For example, in this latter regard, frontside heat extraction structures may be deposited onto the undersides of retention clips 78 (e.g., by inkjet printing, doctor blading, needle dispense, spray application, or the like) or instead bonded to retention clips 78 in sheet form (e.g., frontside heat extraction structures 18 may be acquired as a sheet having an adhesive backing, which can be pressed against retention clips 78 to apply heat extraction structures 18 thereto). Various other fabrication techniques for forming frontside heat extraction structures 18 and retention clips 78 (if present) are also possible in further implementations.

Numerous different approaches can be employed to fasten, bond, or otherwise join retention clip 78 to base flange 30. For example, a thermally-conductive or non-thermally-conductive bonding material can be utilized to bond retention clip 78 to base flange 30 in embodiments, which may be deposited utilizing a three dimensional printer in certain embodiments. A metal particle-containing sintered precursor material can also be deposited at the junctures of retention clip 78 and base flange 30 and then subject to heat treatment to yield sintered bond layers affixing retention clip 78 to base flange 30. In other instances, a different permanent joinder technique can be employed, such as ultrasonic welding. As another possibility, solder can be applied to the ends of retention clip 78 (e.g., as a finish or as a paste initially deposited onto base flange 30 or the underside of foot sections 82) and subject to reflow to create a mechanical joint. In the illustrated example, specifically, a staking operation is utilized to join retention clip 78 to base flange 30. To facilitate such a staking operation, base flange 30 is produced to include one or more retention posts 88, which extend upwardly from die support surface 46. Retention posts 88 are received in openings 90 provided in foot sections 82 of retention clip 78 (identified in FIG. 4) when retention clip 78 is positioned on base flange 30, over frontside heat extraction structure 18, and RF power die 22. Each retention post 88 is then physically deformed to physically lock or capture retention clip 78 against base flange 30. An example of one such staking operation is shown in a two-step sequence FIG. 8. As indicated on the left side of FIG. 8, a staking tool 92 is brought into contact with a head portion of a given retention post 88. Sufficient pressure is applied to circumferentially-expand or splay-out or expand the head portion of the retention post 88, as further shown on the right side of FIG. 8. Heat may or may not be applied during the staking process, which may be repeated on an iterative basis to circumferentially-expand the head portions of the other retention posts 88. By circumferentially-expanding the head portion of each retention post 88 in this manner, each retention post 88 may be physically prevented from passing through its corresponding opening foot sections 82 and retention clip 78 may be captured against base flange 30. Such a process advantageous secures retention clip 78 to base flange 30 in a secure manner without the usage of an adhesive or other bonding material, and while preventing (or minimizing) additional heating or curing steps.

There has thus been provided an example embodiment of a power amplifier device (power amplifier package 16) including a frontside heat extraction structure 18, which acts as a highly efficient thermal conduit for extracting excess heat from locations in close proximity to the heat-generating transistor within an RF power die (e.g., the channel region of FET 70 integrally formed in RF power die 22) and transferring such heat to the heatsink region or regions of a die support substrate (e.g., the body of a base flange 30) to which the RF power die is attached. In so doing, frontside heat extraction structure 18 brings about appreciable reductions in local temperatures within and adjacent the transistor channel during device operation. The degree to which frontside heat extraction structure 18 may reduce local channel temperatures during operation of power amplifier package 16 will vary depending upon various factors, such as the power density of FET 70, the thermal conductivity of frontside heat extraction structure 18, and the thermal conductivity through the body of RF power die 22. Physical testing and simulation results have, however, demonstrated that sufficient reductions (e.g., reductions approaching or exceeding 29%) in the thermal resistance along the primary heat extraction path extending from an RF power die to a thermally-conductive substrate or substrate region can be achieved. So too may provision of the above-described frontside heat extraction structure 18 further reduce peak temperatures and average temperature distributions within the body of semiconductor material in which the transistor channel is formed, as further demonstrated by the heat map simulations discussed below in connection with FIGS. 9 and 10.

Figure 9:
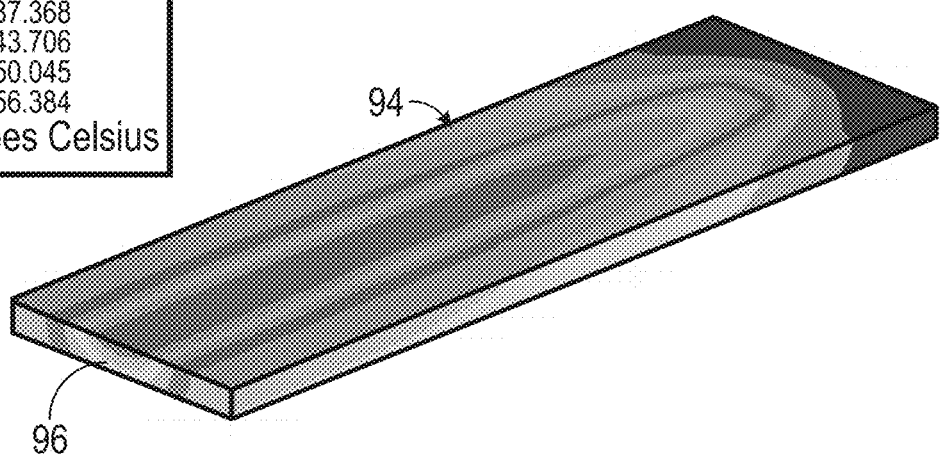
FIG. 9 is a heat map simulation for a body of semiconductor material (here, gallium nitride (GaN)) in which a transistor channel is formed and which is included in a power amplifier device lacking a frontside heat extraction structure.
Figure 10:
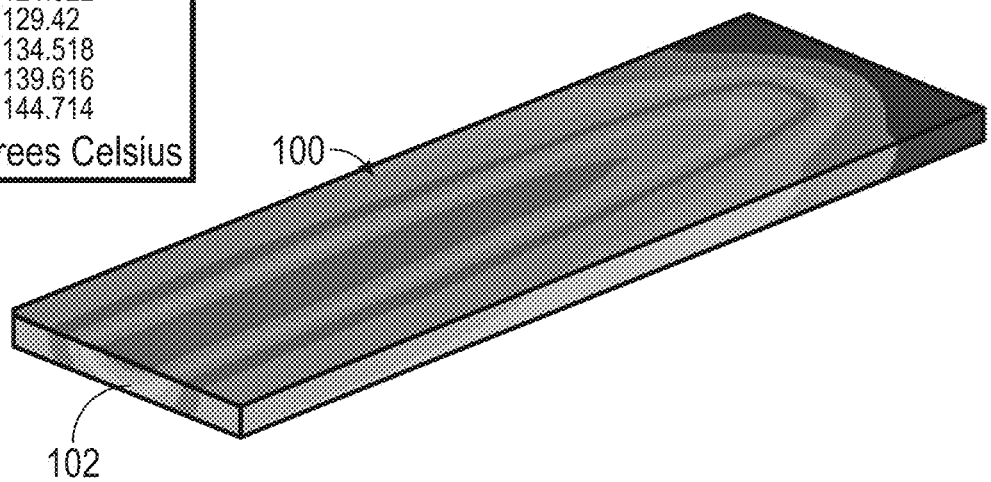
FIG. 10 is a heat map simulation for a semiconductor material (GaN) body comparable to that shown in FIG. 9, but included in a power amplifier device having a frontside heat extraction structure similar to that shown in FIGS. 1-5.

Progressing to FIGS. 9 and 10, simulated three dimensional (3D) heat maps are presented demonstrating the effectiveness of frontside heat extraction structure 18 in reducing local channel temperature during operation of a power amplifier device, such as power amplifier package 16 described above in conjunction with FIGS. 1-5. Referring initially to FIG. 9, there is shown a 3D heatmap of a block or body 94 of semiconductor material (here, simulated as GaN) in which a transistor channel region 96 is formed. GaN body 94 is contained within a power amplifier device lacking a frontside heat extraction structure. As indicated by key 98, local peak temperatures exceeding 156 degrees Celsius (° C.) develop within a central portion of transistor channel region 96 during transistor operation or, more generally, during operation of the package in which the transistor (and the host RF power die) is contained. Comparatively, FIG. 10 presents a 3D heat map for an identical GaN block or body 100 containing a transistor channel region 102 and paired with a non-illustrated frontside heat extraction structure. Here, the non-illustrated frontside heat extraction structure is modeled as similar or identical to that shown in FIGS. 1-5, while composed of a PGS material of the type described above. As indicated by key 104 in FIG. 10, the peak temperatures within transistor channel region 102 are significantly reduced (here, by about 12° C. or by about 7.5%) within the transistor channel region during transistor operation. Concurrently, the global temperature average or temperature distribution across the GaN body, as a whole, is likewise reduced as compared to GaN body 94 shown in FIG. 9 and lacking a frontside heat extraction structure providing enhanced heat extraction. Such significant reductions in peak temperatures and average temperature distributions within and adjacent the transistor region of an RF power die can improve die performance, while improving the overall reliability of the power amplifier device in which the power RF die is contained.

Examples of Power Amplifier Devices Including Frontside Heat Extraction Structures and Lacking Retention Clips In the above-described embodiment, the transistor-overlay portion and the heatsink coupling portions of the frontside heat extraction structure are integrally formed as a single piece, such as a strip of PGS or another high thermal conductivity material. In further embodiments, the transistor-overlay portion and the heatsink coupling portions the frontside heat extraction structure may be separately fabricated at different stages of manufacture. Such an approach may allow the frontside heat extraction structure to be produced, at least in part, during wafer level processing to enhance process efficiency and lower fabrication costs. Additionally, a retention clip may be omitted in such embodiments, particularly when both the transistor-overlay portion and the heatsink coupling portions are directly bonded to surfaces of a given RF power die; e.g., by direct deposition or adhesion onto surfaces the RF power die. An additional example of a power transistor device having a frontside heat extraction structure including separately-formed transistor-overlay and heatsink coupling portions will now be described in conjunction with FIGS. 11 and 12, while an example method for fabricating the frontside heat extraction structure during wafer level processing is further described below in conjunction with FIGS. 13 and 14.

Figure 11:
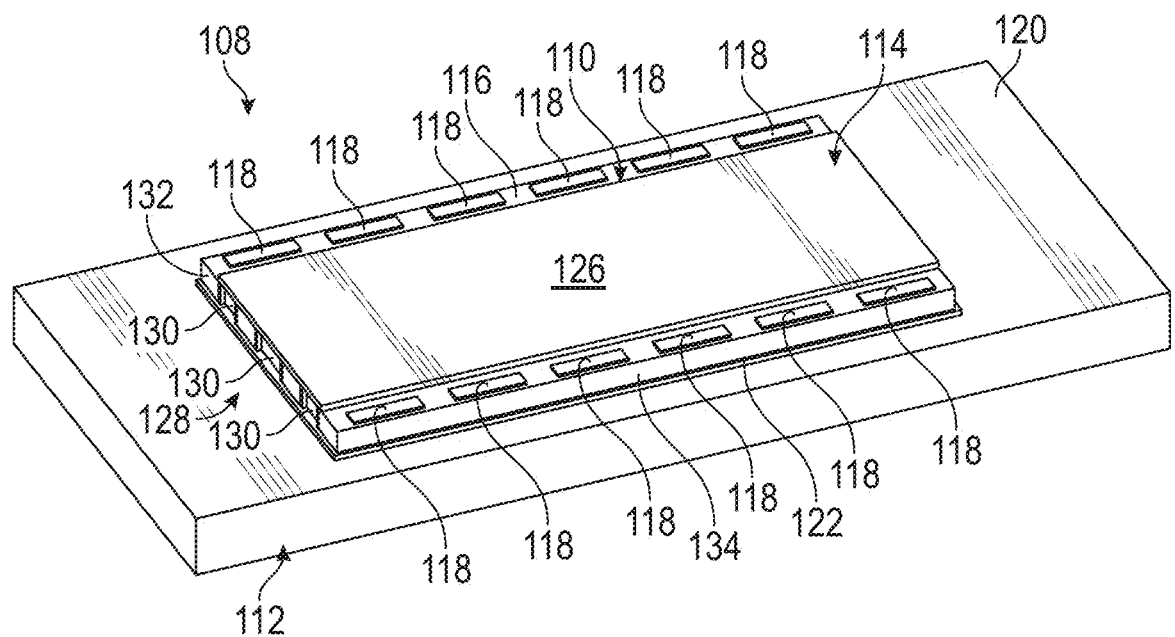
FIGS. 11 and 12 are isometric views of an example frontside heat extraction structure (partially hidden from view in FIG. 12), an RF power die, and a portion of a base flange suitably incorporated into a power amplifier device, such as a power amplifier package similar to that shown in FIGS. 1 and 2, in further embodiments of the present disclosure.

FIG. 11 is a simplified isometric view of a power amplifier package 108, which is partially shown and depicted in accordance with a further example embodiment of the present disclosure. The illustrated portion of power amplifier package 108 includes an RF power die 110 bearing a transistor IC, a thermally-conductive substrate or base flange 112 to which RF power die 110 is attached, and a frontside heat extraction structure 114 formed over and across the frontside of RF power die 110. The non-illustrated portions of power amplifier package 108 may be similar, if not substantially identical to the corresponding components of power amplifier package 16 described above in connection with FIGS. 1-4. Accordingly, when fully assembled, power amplifier package 108 may include a molded package body, an air cavity defined by the package body, and package leads electrically interconnected with the terminals or bond pads 118 of RF power die 110 by, for example, wire bonding or utilizing another interconnection approach. In other instances, the core structure shown in FIGS. 11 and 12 may be integrated into a different type of power amplifier package, such as a molded or encapsulated power amplifier package lacking an air cavity.

RF power die 110 includes a frontside 116, an opposing backside (hidden from view in FIGS. 11 and 12), and two rows of bond pads 118 spaced along the longitudinal edge regions of frontside 116. A power RF transistor IC is integrated into RF power die 110 and includes at least one transistor channel formed in a body or layer of semiconductor material, which forms a part or the entirety of the body of die 110. For the purposes of illustration, and in a manner similar to FET 70 of FIG. 4, one such transistor in the form of a FET 124 having an interdigitated or comb-style transistor finger layout is generically illustrated as formed on and below a surface of RF power die 110 in FIG. 12. To reveal the general structure of FET 124 the frontside layers formed over the body of RF power die 110 are hidden from view, as is transistor-overlay portion 126 of frontside heat extraction structure 114 (described below). Again, the depicted features are provided by way of generalized illustration only, noting that the drain lines, drain manifold, gate contact fingers, gate manifold, and similar features will be located beneath the outermost frontside layer of RF power die 110 and thus not visible in actual implementations of power amplifier package 108. Additionally, and as also noted above, multiple transistors can be formed on RF power die 110, various different transistor arrangements can be implemented, and other transistor technologies (e.g., bipolar transistors) can be utilized in further implementations of power amplifier package 108.

Frontside heat extraction structure 114 includes a central transistor-overlay portion 126 from which two heatsink coupling portions 128 extend in opposing directions. Transistor-overlay portion 126 of frontside heat extraction structure 114 may be similar, if not substantially identical to transistor-overlay portion 72 of frontside heat dissipation structure 18 described above in connection with FIGS. 1-5. For example, transistor-overlay portion 126 may span the length of RF power die 110, as taken along a longitudinal axis perpendicular to a vertical axis or centerline orthogonal to frontside 116 of RF power die 110. Further, transistor-overlay portion 126 of frontside heat extraction structure 114 may vertically overlap at least a majority, if not the substantial entirety of the transistor channel or channels formed in the body of RF power die 110. In certain embodiments, transistor-overlay portion 126 may be composed of a thermally-conductive material deposited directly onto frontside 116 of RF power die 110. In other embodiments, transistor-overlay portion 126 may be a pre-fabricated component, such as a strip of a PGS material or another highly thermal conductivity material, joined to frontside 116 of RF power die 110 via a thermally-conductive bond layer. Suitable materials include those listed above, such as materials containing graphene, graphite, CNTs, or another carbon allotrope. Generally, transistor-overlay portion 126 may be composed of a material having a thermal conductivity exceeding 100 W/mk and, perhaps, a thermal conductivity approaching or exceeding 1000 W/mk as taken along the primary heat extraction path extending from RF power die 110, through frontside heat extraction structure 18, and to base flange 112.

Figure 12:
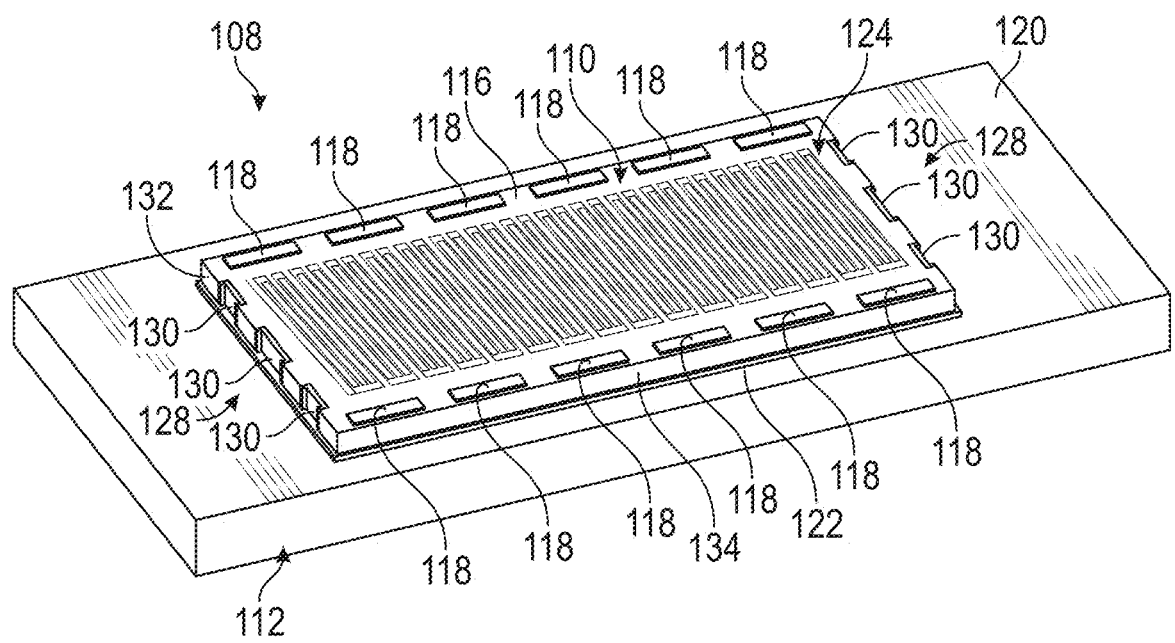

In the example of FIGS. 11 and 12, and in contrast to heatsink coupling portions 74 of frontside heat extraction structure 18 (FIGS. 1-5), heatsink coupling portion 128 of frontside heat extraction structure 114 are composed of a thermally-conductive material deposited directly onto selected sidewalls 132 of RF power die 110. In this regard, each heatsink coupling portion 128 may be formed by one or more vertically-extending thermally-conductive columns 130, which are deposited onto sidewalls 132 of RF power die 110 during wafer level processing Specifically, in embodiments, die sidewalls 132 may be imparted with notched or crenulated geometries, and thermally-conductive columns 130 may be formed to fill or partially fill the recesses of castellated or crenulated sidewalls 132 of RF power die 110. In the illustrated example, specifically, crenulated sidewalls 132 extend between non-crenulated sidewalls 134 of RF power die 110, which extend parallel to bond pad rows 118 Located on the frontside of die 110. Thermally-conductive columns 130, as formed in the sidewall crenulations, can be composed of various thermally-conductive materials including, for example, metallic materials (e.g., a material predominately composed of at least one of Au, Al, Ag, or Cu, by weight) deposited into the crenulations during wafer level processing of RF power die 110, as described below in connection with FIGS. 13 and 14. Further, in various implementations, thermally-conductive columns 130 may be composed of a having a higher thermal than the thermal conductivity of RF power die 110, taken through its thickness, while being less than the thermal conductivity of transistor-overlay portion 126, as taken along the primary heat extraction path.

At their lower terminal ends, thermally-conductive columns 130 are placed in direct thermal contact with die support surface 120 of base flange 112. In certain embodiments, thermally-conductive columns 130 may be placed in direct contact with die support surface 120. Alternatively, and as indicated in FIGS. 11 and 12, thermally-conductive columns 130 may be thermally coupled to die support surface 120 of base flange 112 utilizing a thermally-conductive bond layer 122. Additionally, thermally-conductive bond layer 122 may attach the backside or backside of RF power die 110 is attached to die support surface 120 of base flange 112 by a bond layer 122. Accordingly, thermally-conductive bond layer 122 can be formed of any material capable of reliably securing RF power die to base flange 112, while having a relatively high thermal conductivity; e.g., a thermal conductivity exceeding 30 W/mk and, perhaps, exceeding 100 W/mk. In one embodiment, bond layer 122 is produced as a sintered bond layer predominately composed of Cu, Ag, Au, or a mixture thereof, by weight. Such a sintered bond layer may or may not contain organic materials, such as an epoxy added for strengthening purposes. In other embodiments, a different thermally-conductive bonding material (e.g., a metal-filled epoxy) can be utilized to form bond layer 122. By mounting RF power die 110 to die support surface 120, while thermally coupling thermally-conductive columns 130 to base flange 112, a highly conductive primary heat extraction path is completed extending from the points at which transistor-overlay portion 126 contact die frontside 116 vertically from the channel of FET 124, through thermally-conductive columns 130, through thermally-conductive bond layer 122, and to the base flange 112. Through provision of such a low resistance primary heat extraction path, the flow of excess heat from RF power die 110 to the base flange 112 is enhanced to reduce transistor channel temperatures during operation of RF power die 110 and, more generally, power amplifier package 108.

Figure 13:
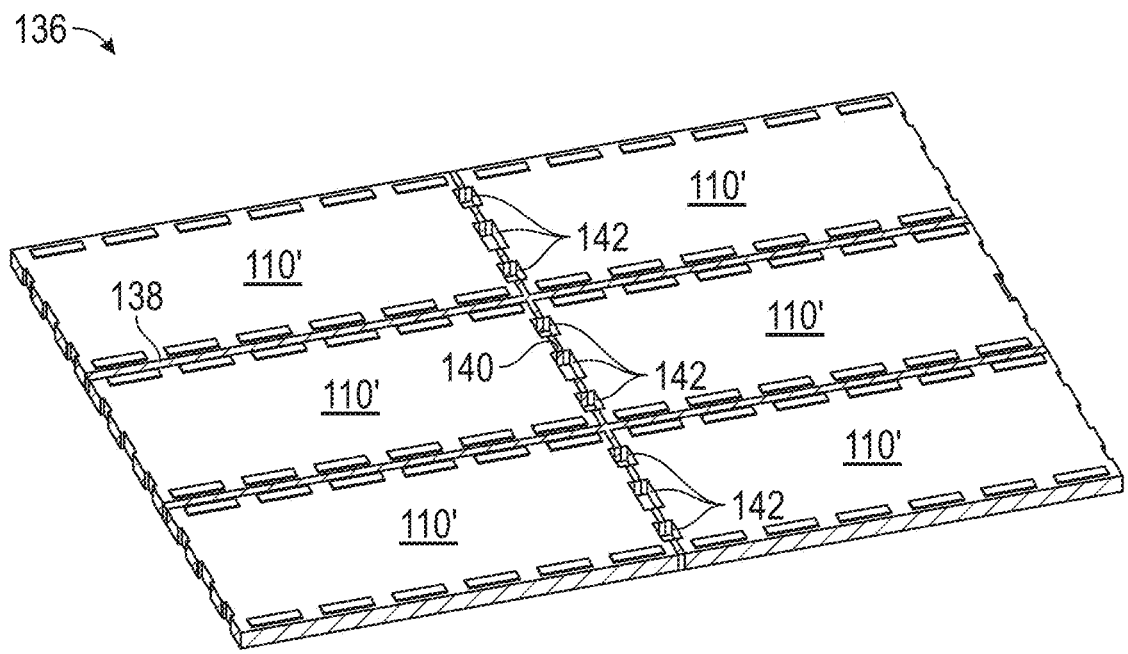
FIGS. 13 and 14 are isometric views illustrating one manner in which embodiments of the frontside heat extraction structure shown in FIGS. 11 and 12 can be fabricated, in whole or in part, during wafer level processing.
Figure 14:
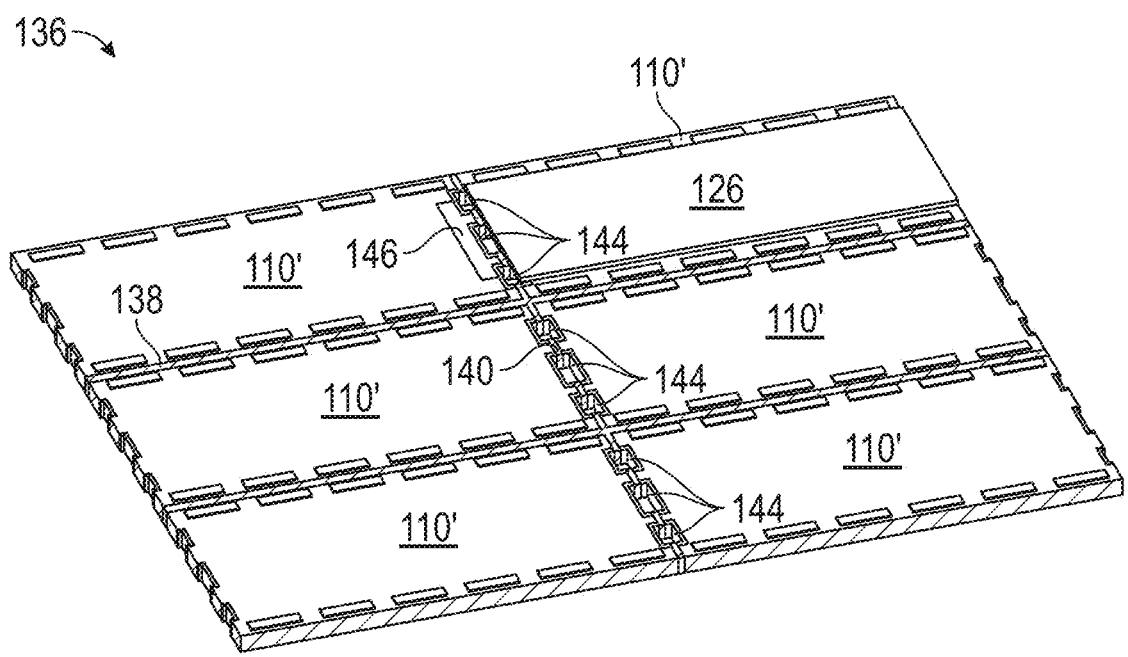

As noted above, frontside heat extraction structure 114 may be formed, at least in part, over RF power die 110 during wafer level processing. This may be appreciated by referring to FIGS. 13 and 14, which illustrate one manner in which frontside heat extraction structure 114 can be fabricated, while RF power die 110' remains interconnected with other RF power dies 110' as a device wafer 136. In numbering FIGS. 13 and 14, like reference numerals are carried-over from FIGS. 11 and 12, with a prime symbol appended to reference numeral 110 to indicate that RF power dies 110' are shown prior to singulation. Only a limited portion of device wafer 136 is shown including six RF power dies 110', noting that wafer 136 will typically have a larger circular shape and include a relatively large number of interconnected dies. For clarity, the boundaries separating of interconnected RF power dies 110' are generally shown in FIGS. 13 and 14, as are saw streets 138, 140 (cross-hatched in FIGS. 13 and 14) along which RF power dies 110' are subsequently separated or cleaved during wager singulation. At the stage of manufacture shown in FIG. 13, through-holes or vertical openings 142 have been formed, such as by laser drilling or plasma etching, through targeted regions of RF power die wafer 136. Specifically, vertical openings 142 are formed to penetrate selected outer peripheral sidewalls of RF power dies 110', while imparting the die sidewalls with a slotted or crenulated geometry upon wafer singulation. In this regard, vertical openings 142 may be formed to extend across the saw streets of wafer 136 and into selected die sidewalls in a manner imparting the sidewalls with a slotted or crenulated geometry, as shown.

After formation of vertical openings 142 through selected regions of device wafer 136, a metallic material 144 then is deposited into openings 142 and, therefore, onto the recesses of the crenulated sidewalls of RF power dies 110'. The deposited metallic material 144 fills or partially fills openings 142 and defines the heatsink coupling portions of the frontside heat extraction structures 114 for each RF power die 110 upon wafer singulation; e.g., the singulated portions of the deposited metallic material may form thermally-conductive columns 130 described above in connection with FIGS. 11 and 12. In embodiments, a material principally composed of Cu, Ag, Al, or Au, by weight, may be plated into the recesses of the crenulated sidewalls of RF power dies 110', possibly in conjunction with plating of any vias (if present) desirably formed in RF power dies 110'. Additionally, other patterned metal structures may be created during (or perhaps) prior to this step in certain implementations. For example, as shown exclusively for RF power die 110' appearing in the top left of FIG. 14, an enlarged pad region 146 may be formed in conjunction with deposition of metallic material 144. Enlarged pad region 146 facilitates thermal coupling between the heatsink coupling regions formed from material 144 and the subsequently-applied transistor-overlay portions. Accordingly, at some juncture following deposition of metallic material 144, the transistor-overlay portions of the frontside heat extraction structures are then applied over the frontside of each of the RF power dies, whether prior to or after wafer singulation. Following wafer singulation, each unit RF power die 110 and its associated frontside heat extraction structure 114 can be incorporated into a power amplifier package or module to complete manufacture of the power amplifier devices. In further embodiments, a similar process can be utilized to produce a plurality of power amplifier devices containing frontside heat extraction structures during wafer level processing, in which a thermally-conductive material is applied into openings 142 in a different manner; e.g., by stencil application or fine needle dispense of a precursor material in a flowable (wet) state, with subsequent curing performed to transform the material into thermally-conductive bodies serving as thermally-conductive columns 130. In still other embodiments, the power amplifier devices described herein can be fabricated in other manners, whether on an individual basis or in parallel.

Figure 15:
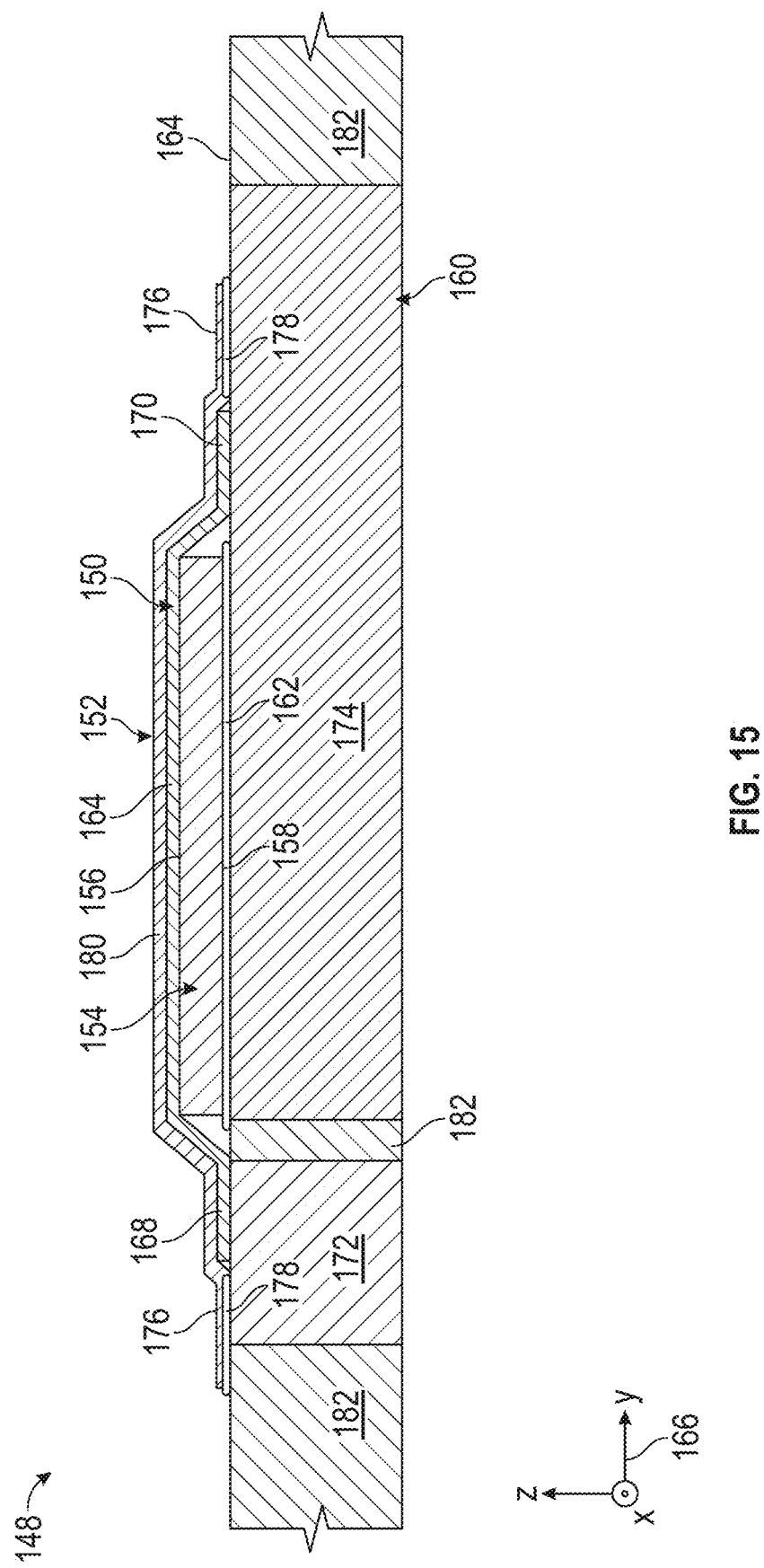
FIG. 15 is a simplified cross-sectional view of an example power amplifier device (here, a power amplifier module) containing a frontside heat extraction structure and a retention clip, as illustrated in accordance with a still further example embodiment of the present disclosure.

Example Power Amplification Module Containing a Frontside Heat Extraction Structure As previously emphasized, embodiments of the power amplification device can be fabricated as a power amplification package, such as example power amplification package 16 discussed above in connection with FIGS. 1-5, or a power amplification module (PAM). In this regard, FIG. 15 provides simplified cross-sectional view of an example power amplifier device in the form of a PAM 148 (partially shown) containing a frontside heat extraction structure 150 and a retention clip 152, as illustrated in accordance with a further example embodiment of the present disclosure. As does power amplifier package 16 (FIGS. 1-5), PAM 148 includes at least one RF power die 154 having a frontside 156 and an opposing backside 158. RF power die 154 is attached to a substrate 160 by a die bond layer 162. Only a limited region of substrate 160 is shown in FIG. 15, noting that various other microelectronic components, such as other dies and SMDs, may be distributed across the non-illustrated regions of substrate 160 and interconnected by traces (not shown) formed on die support surface 164 of substrate 160 (or other interconnect features). RF power die 154 is mounted to substrate 160 in an inverted orientation such that backside 158 of RF power die 154 faces die support surface 164 of substrate 160, while frontside 156 of RF power die 154 faces in an upward direction away from substrate 160. Although not visible in the cross-section of FIG. 15, bond pads may be formed on frontside 156 of RF power die 154 for electrical connection to traces or other electrically-conductive features of substrate 160 utilizing a suitable interconnect feature, such as a bond wires (also not shown for clarity). In embodiments in which backside 158 serves as an electrically-conductive (e.g., ground) terminal of RF power die 154, die bond layer 162 may be composed of an electrically-conductive material, such a metal-filled epoxy, a solder material, a sintered material, or any of the other electrically-conductive bonding materials mentioned herein.

Frontside heat extraction structure 150 and retention clip 152 may be similar to, if not substantially identical to frontside heat extraction structure 18 and retention clip 78, respectively, described above in connection with FIGS. 1-8. Accordingly, frontside heat extraction structure 150 includes a transistor-overlay portion 164 covering at least a portion, if not the majority of frontside 156 of RF power die 154, by area. Further, transistor-overlay portion 164 at least partially overlaps over vertically overlies a transistor formed in RF power die 154, as a vertical axis extending through RF power die 154 and transistor-overlay portion 164 (corresponding to the Z-axis of coordinate legend 166). Transistor-overlay portion 164 of frontside heat extraction structure 150 is placed in direct thermal contact with frontside 156 of RF power die 154. Transistor-overlay portion 164 may intimately contact die frontside 156 as shown in FIG. 15; or, in alternative embodiments, may be bonded thereto utilizing one or more layers of a thermally-conductive bonding material. In at least some embodiments, transistor-overlay portion 164 may overlap at least a majority, if not the substantial entirety of the channel of the transistor integrated into RF power die 154 by surface area, as taken along the vertical axis. Frontside heat extraction structure 150 further includes first and second heatsink coupling portions 168, 170, which extend from opposing edges of transistor-overlay portion 164 in opposing directions to extend downwardly relative to die frontside 156 toward substrate 160 and ultimately contact heatsink regions 172, 174 of substrate 160, as described more fully below. RF power die 154 may extend beyond frontside heat extraction structure 150 and retention clip 152 along the X-axis of coordinate legend to expose edge regions of frontside 156 along with rows of non-illustrated bond pads are located for interconnection purposes in a manner analogous to that descried above in connection with FIGS. 1-4.

As stated above, transistor-overlay portion 164 of frontside heat extraction structure 150 is placed in direct thermal contact with frontside 156 of RF power die 154. So too may heatsink coupling portions 168, 170 of frontside heat extraction structure 150 be placed in direct thermal contact with heatsink regions 172, 174 of substrate 160, whether by intimate contact (as shown) or utilizing a thermally-conductive bonding material, in various implementations. The opposing ends of retention clip 152 are affixed to substrate 160, with retention clip 152 extending over frontside heat extraction structure 150 to physically capture frontside heat extraction structure 150 against RF power die 154. In contrast to retention clip 78 described above in connection with FIGS. 1-8, the outer terminal ends or foot sections 176 of retention clip 152 are joined to substrate 160 utilizing a bond material 178 in the example of FIG. 15. Bonding material 178 can be composed of any material suitable for forming a robust bond between retention clip 152 and substrate 160. Bonding material 178 may or may not be thermally-conductive, again noting that retention clip 172 may contribute somewhat to the heat dissipation capabilities of PAM 148, but is less consequent in this regard than is frontside heat extraction structure 150. Finally, as previously indicated, retention clip 152 may be fabricated (e.g., by forming a pre-bend in mid-section 180 of clip 152 when composed of a metal, a polymer, or another material having an inherent resiliency) to exert a resilient bias force pressing transistor-overlay portion 164 of frontside heat extraction structure 150 against frontside 156 of RF power die 154.

Once again, transistor-overlay portion 164 and heatsink coupling portions 168, 170 of frontside heat extraction structure 150 can be separately fabricated or, instead, formed as a monolithic or unitary body of material during manufacture of PAM 148. For example, in various embodiments, transistor-overlay portion 164 and heatsink coupling portions 168, 170 may be integrally formed as a unitary body of material having a thermal conductivity exceeding 100 Watts per meter-Kelvin, as taken along a primary heat extraction path extending from frontside 156 of RF power die 154 to either of heatsink regions 172, 174 of substrate 160. In this regard, embodiments of frontside heat extraction structure 150 may be formed utilizing a single strip or elongated body of a high thermal conductivity material (e.g., a flexible PGS strip), which spans the length of RF power die 154, as taken along a longitudinal axis of PAM 148 (corresponding to the Y-axis of coordinate legend 166). In other embodiments, transistor-overlay portion 164 or, perhaps, the entirety of frontside heat extraction structure 150 may be composed of a high thermal conductivity material, such as a diamond polycarbonate material, a diamond-metal composite (e.g., diamond Au, diamond Ag, and diamond Cu), a pyrolytic graphite, or a material containing allotropes of carbon, such as those materials previously listed is describing power amplification package 16. Further, frontside heat extraction structure 150 may be formed such that the primary heat extraction path has a thermal conductivity at least ten times greater than the thermal conductivity of RF power die 154, as taken through the thickness of die 154; that is, along a vertical axis through die 154 parallel to the Z-axis of coordinate legend 166.

With continued reference to the example embodiment of FIG. 15, substrate 160 is at least partially composed of one or more dielectric materials, such as a ceramic, a resin (e.g., a fiberglass epoxy resin), a polymer, or a similar material; and may be predominately composed of one or more dielectric materials 182, by volume. Such dielectric materials may possess a relatively low thermal conductivity. Comparatively, heatsink regions 172, 174 of substrate 160 are predominately or entirely composed of a thermally-conductive material or materials, whether metallic or non-metallic in composition, suitable for serving as a thermally-conductive heatsink or thermal conduit and, perhaps, also provide signal or power conduction; e.g., in the illustrated embodiment, heatsink region 174 may be electrically-active and help form a ground return path electrically coupled to backside 158 of RF power die 154 through bond layer 162. In various embodiments, substrate 160 may be a PCB or similar laminated structure, a cored or coreless substrate compiled from a single layer or multiple layers, a ceramic substrate, or another substrate suitable for usage in PAM manufacture. Heatsink regions 172, 174 may be metallic coins (blocks or slugs) in embodiments; or, instead, via structures, such as bar vias or via farms, which are predominately composed of one or more metal constituents (e.g., Cu) by volume to impart heatsink regions 172, 174 with a relatively high thermal conductivity, taken in combination with the volume of these regions (which may be equivalent to or exceed the volume of RF power die 154 in embodiments). In other instances, such as when either or both of heatsink regions 172, 174 are electrically-inactive, heatsink regions 172, 174 may be composed of a material that is both electrically insulative and thermally conductive, such as aluminum nitride. By virtue of such a structural arrangement, a high thermal performance PAM (e.g., PAM 148) is produced capable of efficiently dissipating excess heat generated at and adjacent the transistor channel(s) formed in the RF power die 154 by transferring high quantities of heat to one or more heatsink regions of a die supporting substrate; e.g., in the illustrated example, to heatsink regions 172, 174 of substrate 160. Heatsink regions 172, 174 may, in turn, be thermally coupled to an assembly-level heatsink (not shown), such as a metal chassis, a fin structure, or a similar thermally-conductive body included within the electronic assembly or system in which PAM 148 is ultimately installed. Such a high thermal performance PAM may be well-suited for usage in massive multiple input, multiple output (MIMO) antenna applications and other high thermal RF applications in which efficient heat dissipation from power amplifier devices is sought.

CONCLUSION

There has thus been provided power amplifier devices containing RF power dies and frontside heat extraction structures, which provide enhanced heat flow from locations adjacent transistor channels to heatsink regions of a die support substrate. By virtue of the integration of such frontside heat extraction structures, the above-described power amplifier devices are capable of operating with significantly lower peak and global average temperatures within the transistor channel region to bring about improvements in RF power die performance, reliability, and lifespan. Embodiments of the frontside heat extraction structures may be beneficially utilized in conjunction with high power density transistors, such as transistors realized utilizing layered GaN die technologies, as well as power amplifier transistors operated at higher RF bands; e.g., frequencies approaching or exceeding 3 GHz. This stated, the frontside heat extraction structures are not limited to usage with any particular die technology, power amplifier device type, or transistor type. Rather, the frontside heat extraction structures can be integrated into various power amplifier packages, modules, and other devices containing different die and transistor types, including FETs and bipolar transistors formed on bulk Si, GaN die structures, and other layered die structures. Further, while principally described above in the context of power amplifier packages containing metallic base flanges, embodiments of the power amplifier devices can also assume the form of modules fabricated on various substrate types (e.g., PCBs and ceramic substrates) have thermally-conductive heatsink regions suitable for absorbing heat conductively transported to the heatsink region by a frontside heat extraction structure. The foregoing has also provided embodiments of methods for fabricating power amplifier devices containing frontside heat extraction structures, as well as methods for fabricating components included in or associated with such structures.

Embodiments of the power amplifier device include a substrate, an RF power die mounted to a die support surface of the substrate, and a frontside heat extraction structure further attached to the die support surface. The substrate includes at least one heatsink region; that is, the substrate may be partially formed from or include a thermally-conductive portion or section serving as a heatsink region (e.g., as in the case of a PCB having an embedded coin or via farm serving as a heatsink region) or the substantial entirety of the substrate may serve as a heatsink region (e.g., as in the case of a metallic base flange). The RF power die includes a backside bonded to the die support surface of the substrate, a frontside opposite the backside as taken along a vertical axis orthogonal to the die support surface, and a transistor formed in the RF power die between the backside and the frontside of the RF power die. The frontside heat extraction structure includes a transistor-overlay portion in direct thermal contact with the frontside of the RF power die, a first heatsink coupling portion thermally coupled to the heatsink region, and a primary heat extraction path extending from the transistor-overlay portion to the first heatsink coupling portion. The primary heat extraction path promotes conductive heat transfer from the RF power die to the heatsink region, which may reduce local temperatures within a channel of the transistor during operation of the power amplifier device in embodiments.

In further embodiments, a method for fabricating a power amplifier device includes the steps or processes of: (i) bonding a backside of an RF power die to a substrate comprising a heatsink region; and (ii) attaching a frontside heat extraction structure to the substrate after or concurrent with bonding the backside of the RF power die to the substrate. The frontside heat extraction structure is attached to the substrate such that a transistor-overlay portion of the frontside heat extraction structure is placed in direct thermal contact with a frontside of the RF power die, a heatsink coupling portion of the frontside heat extraction structure is thermally coupled to the heatsink region of the substrate to complete a primary heat extraction path extending from RF power die, through the frontside heat extraction structure, and to the heatsink region. In embodiments, the primary heat extraction path promoting conductive heat flow from the RF power die to the heatsink region to reduce local temperatures within the transistor channel during operation of the power amplifier device. Further, in certain instances, the step of further attaching involves securing a thermally-conductive strip of material over the RF power die and to the substrate. Securing may involve, in turn, placing the thermally-conductive strip of material in a desired position over the RF power die and the substrate, as well as joining a retention clip to the substrate to capture the thermally-conductive strip of material against the RF power die and the heatsink region after or concurrent with the step of placing. In still other instances, the method may further include the steps or process depositing a first thermally-conductive material onto a (e.g., crenulated) sidewall of the RF power die to form the heatsink coupling portion of the frontside heat extraction structure; and, after depositing, applying a second thermally-conductive material over the frontside of the RF power die to define the transistor-overlay portion of the frontside heat extraction structure.

While at least one example embodiment has been presented in the foregoing Detailed Description, it should be appreciated that a vast number of variations exist. It should also be appreciated that the example embodiment or example embodiments are only examples, and are not intended to limit the scope, applicability, or configuration of the invention in any way. Rather, the foregoing Detailed Description will provide those skilled in the art with a convenient road map for implementing an example embodiment of the invention, it being understood that various changes may be made in the function and arrangement of elements described in an example embodiment without departing from the scope of the invention as set forth in the appended claims. Numerical identifiers, such as "first," "second," "third," and the like may have been used above in accordance with the order in which certain elements were introduced during the course of the foregoing Detailed Description. Such numerical identifiers may also be used in the subsequent Claims to indicate order of introduction in the Claims. Accordingly, such numerical identifiers may vary between the Detailed Description and the subsequent Claims to reflect differences in the order of introduction of elements.

What is claimed is:

1. A power amplifier device, comprising:
    a substrate comprising a heatsink region and a die support surface;
    a radio frequency (RF) power die including a backside bonded to the die support surface of the substrate, a frontside opposite the backside as taken along a vertical axis orthogonal to the die support surface, and a transistor formed in the RF power die between the backside and the frontside of the RF power die;
    a frontside heat extraction structure attached to the die support surface of the substrate and extending at least partially over the RF power die, the frontside heat extraction structure comprising:
        a transistor-overlay portion in direct thermal contact with the frontside of the RF power die and at least partially overlapping the transistor as taken along the vertical axis; and a first heatsink coupling portion thermally coupled to the heatsink region; and a primary heat extraction path extending from the RF power die, through the frontside heat extraction structure, and to the heatsink region of the substrate, the primary heat extraction path promoting conductive heat transfer from the RF power die to the heatsink region.

2. The power amplifier device of claim 1, wherein the transistor comprises a transistor channel; and wherein the first transistor-overlay portion of the frontside heat removal overlaps at least a majority of the transistor channel by surface area, as taken along the vertical axis.

3. The power amplifier device of claim 1, wherein the RF power die further comprises first and second rows of bond pads located on the frontside; and wherein the transistor-overlay portion extends between and substantially parallel to the first and second rows of bond pads.

4. The power amplifier device of claim 1, wherein the RF power die has a die thermal conductivity taken from the frontside to the backside of the RF power die;

wherein the primary heat extraction path has a thermal conductivity at least ten times greater than the die thermal conductivity.

5. The power amplifier device of claim 1, wherein the frontside heat extraction structure spans a length of the RF power die, as taken along a longitudinal axis of the power amplifier device perpendicular to the vertical axis.

6. The power amplifier device of claim 1, wherein the frontside heat extraction structure further comprises a second heatsink coupling portion joined to the transistor-overlay portion opposite the first heatsink coupling portion, as taken along a longitudinal axis of the power amplifier device perpendicular to the vertical axis.

7. The power amplifier device of claim 6, wherein the transistor-overlay portion, the first heatsink coupling portion, and the second heatsink coupling portion are integrally formed as a unitary body of material having a thermal conductivity exceeding 100 Watts per meter-Kelvin, as taken along the primary heat extraction path.

8. The power amplifier device of claim 1, wherein the transistor-overlay portion is at least partly composed of a first material having a first thermal conductivity, as taken along the primary heat extraction path; and wherein the heatsink coupling portion is at least partly composed of a second material having a second thermal conductivity less than the first thermal conductivity, as taken along the primary heat extraction path.

9. The power amplifier device of claim 8, wherein the heatsink coupling portion is deposited into openings created in a sidewall of the RF power die and extending from the frontside to the backside of the RF power die.

10. The power amplifier device of claim 1, further comprising a retention clip affixed to the substrate and extending over the frontside heat extraction structure to physically capture the frontside heat extraction structure against the RF power die.

11. The power amplifier device of claim 10, wherein the retention clip exerts a resilient bias force pressing the transistor-overlay portion of the frontside heat extraction structure against the frontside of the RF power die.

12. The power amplifier device of claim 1, wherein the transistor-overlay portion of the frontside heat extraction structure directly contacts the frontside of the RF power die.

13. The power amplifier device of claim 12, wherein the heatsink coupling portion of the frontside heat extraction structure directly contacts the heatsink region of the substrate.

14. The power amplifier device of claim 1, wherein the power amplifier device comprises a power amplifier package; and wherein the substrate comprises a metallic base flange having a metallic body serving as the heatsink region, the RF power die located between the transistor-overlay portion of the frontside heat extraction structure and the metallic base flange.

15. The power amplifier device of claim 1, wherein the frontside heat extraction structure is at least partially composed of material containing an allotrope of carbon, while the RF power die is at least partially composed of gallium nitride.

16. A method for fabricating a power amplifier device, comprising:

bonding a backside of a radio frequency (RF) power die to a substrate comprising a heatsink region; and after or concurrent with bonding the backside of the RF power die to the substrate, attaching a frontside heat extraction structure to the substrate such that:

a transistor-overlay portion of the frontside heat extraction structure is placed in direct thermal contact with a frontside of the RF power die;

a heatsink coupling portion of the frontside heat extraction structure is thermally coupled to the heatsink region of the substrate to complete a primary heat extraction path extending from RF power die, through the frontside heat extraction structure, and to the heatsink region.

17. The method of claim 16, wherein attaching comprises securing a thermally-conductive strip of material over the RF power die and to a die support surface of the substrate.

18. The method of claim 17, wherein securing comprises:

placing the thermally-conductive strip of material in a desired position over the RF power die and the substrate; and after or concurrent with placing, joining a retention clip to the substrate to capture the thermally-conductive strip of material against the RF power die and the heatsink region.

19. The method of claim 16, further comprising:

depositing a first thermally-conductive material onto a sidewall of the RF power die to form the heatsink coupling portion of the frontside heat extraction structure; and after depositing, applying a second thermally-conductive material over the frontside of the RF power die to define the transistor-overlay portion of the frontside heat extraction structure.

20. The method of claim 19, wherein depositing comprises depositing the first thermally-conductive material into openings created in a crenulated sidewall of the RF power die, while the RF power die remains interconnected with other RF power dies in wafer form.

* * * * *